United States Patent [19]

Ueda et al.

[11] Patent Number: 5,561,382
[45] Date of Patent: Oct. 1, 1996

[54] BI-CMOS OUTPUT BUFFER CIRCUIT FOR CMOS-TO-ECL CONVERSION

[75] Inventors: Masahiro Ueda; Toshiaki Hanibuchi, both of Itami, Japan

[73] Assignee: Mitsubishi Denki Kabushiki Kaisha, Tokyo, Japan

[21] Appl. No.: 392,321

[22] Filed: Feb. 22, 1995

[30] Foreign Application Priority Data

Apr. 26, 1994 [JP] Japan .................................. 6-088752

[51] Int. Cl.⁶ ................. H03K 19/0948; H03K 19/0175; H03K 19/082
[52] U.S. Cl. ................................ 326/66; 326/126; 326/84
[58] Field of Search ..................... 326/64, 66, 67, 326/75, 77, 78, 109–110, 126–127, 84, 89–90, 18

[56] References Cited

U.S. PATENT DOCUMENTS 5,029,479  6/1991  Jeffery et al. ............................ 326/109
5,237,214  8/1993  Usami ....................................... 326/18
5,331,229  7/1994  Barre ....................................... 326/66

OTHER PUBLICATIONS

MECL System Design Handbook, May 1980, pp. 4 and 5.
JP 59-67728, Apr. 17, 1984, 2 pages.
JP 63-313916, Dec. 22, 1988.

*Primary Examiner*—Edward P. Westin
*Assistant Examiner*—Jon Santamauro
*Attorney, Agent, or Firm*—Oblon, Spivak, McClelland, Maier & Neustadt, P.C.

[57] ABSTRACT

The logic of an intermediate signal ($Y_1$) goes high when an input signal (CI) makes an "L" to "H" transition, and then a transistor ($Q_1$) turns on and a transistor ($Q_2$) turns off. The input signal (CI) at a potential corresponding to the logic "H" at a CMOS level has been applied to the gate of an NMOS transisitor ($N_1$), and the NMOS transistor ($N_1$) turns on rapidly. At this time, only current flowing through the base of an output transistor ($Q_0$) flows through parallel connection of a resistor ($R_2$) and an on-resistance of the NMOS transistor ($N_1$). Since the NMOS transistor ($N_1$) is on, the base potential of the output transistor ($Q_0$) is raised if the resistor ($R_2$) has a high resistance, and current fed from the output transistor ($Q_0$) increases, thereby raising the emitter potential of the output transistor ($Q_0$). Then the logic of an output signal (EO) goes high. Power consumption of an output buffer circuit is reduced.

28 Claims, 19 Drawing Sheets

BI-CMOS OUTPUT BUFFER CIRCUIT FOR CMOS-TO-ECL CONVERSION

BACKGROUND OF THE INVENTION

1. Field of the Invention

The present invention relates to an output buffer circuit for an LSI including bipolar transistors and CMOSs.

2. Description of the Background Art

A. Background Art (A-1) Basic Structure of Level Converter Circuit

FIG. 15 is a block diagram of an exemplary LSI which accomplishes ECL input and output. Power is supplied from two power supplies GND (=0 V) and $V_{EE}$ (<0 V), and an input buffer 1, an internal gate 2, and an output buffer circuit 3 are driven. Application of the BiCMOS technique to these components is disclosed in NEC Technical Journal Vol. 43, No. 12, 1990, pp. 119–121.

FIG. 16 is a circuit diagram of the output buffer circuit 3 of FIG. 15. The output buffer circuit 3 comprises a level shifter $G_{20}$ and a current switch $G_{30}$. Such a construction is disclosed in, for example, Japanese Patent Application Laid-Open No. 63-313916 (1988). The output buffer circuit 3 has the function of converting a CMOS level signal outputted from the internal gate 2 into an ECL level signal.

A signal CI at the CMOS level is applied to an input terminal. For instance, when the input signal CI is "H" at the CMOS level, a PMOS transistor $P_1$ is off. Then current fed from a current source $S_1$ flows through a resistor $R_3$ connected in parallel with the PMOS transistor $P_1$. Thus, the base potential of an NPN transistor $Q_{10}$ is lower than the GND by a constant voltage. A potential lower than the base potential of the NPN transistor $Q_{10}$ by the base-emitter voltage of the transistor $Q_{10}$ is applied to the base of an NPN transistor $Q_1$ serving as an input of the current switch $G_{30}$, and the potential is "L" at the ECL level. Consequently, current fed by an NPN transistor $Q_2$ increases and a voltage drop in a resistor $R_2$ connected to the collector of the transistor $Q_2$ increases. This reduces the base potential of an NPN transistor $Q_0$ for output, and an output signal EO becomes "L" at the ECL level.

On the other hand, when the input signal CI is "L" at the CMOS level, the transistor $P_1$ is on. Current supplied from the current source $S_1$ flows through the transistor $P_1$, and the base potential of the transistor $Q_{10}$ becomes substantially equal to the potential GND (also designating the power supply) of the power supply GND. Then "H" at the ECL level is applied to the base of the transistor $Q_1$ through an emitter-follower circuit comprised of the transistor $Q_{10}$ and a current source $S_2$, and the output signal EO becomes "H" at the ECL level.

The construction of the current switch $G_{30}$ is disadvantageous in that large current is to be fed from the current source $S_3$ connected commonly to the emitters of the transistors $Q_1$ and $Q_2$, resulting in a large amount of power consumption. This disadvantage will be discussed with the description of operation of the circuit of FIG. 16.

In general, an output buffer circuit for outputting the ECL level has an output terminal connected to a terminating power supply $V_{TT}$ (also designating the voltage) through a terminating resistor $R_E$. It is a common practice to select a 50Ω terminating resistor $R_E$ and a −2 V terminating voltage $V_{TT}$. Potentials $V_{OH}$ and $V_{OL}$ corresponding to "H" and "L" at the ECL level are set to about −0.9 V and about − 1.7 V, respectively. A reference potential $V_{BB}$ is set to about −1.3 V which is intermediate the potentials $V_{OH}$ and $V_{OL}$.

FIG. 17 is a circuit diagram of an equivalent circuit including the output transistor $Q_0$ and adjacent components when "H" is applied to the base of the transistor $Q_1$ and the transistor $Q_1$ turns on while the transistor $Q_2$ turns off. Current $I_{OH}$ flowing through the output transistor $Q_0$ is expressed as:

$$I_{OH} = \frac{V_{OH} - V_{TT}}{R_E} \quad (1)$$

Since the transistor $Q_2$ is off, current fed from the current source $S_3$ does not flow through the resistor $R_2$ connected to the base of the transistor $Q_0$, but only a base current $I_{BH}$ of the transistor $Q_0$ flows therethrough. The potential $V_{OH}$ is $$V_{OH} = 0 - I_{BH} R_2 - V_{BE} \quad (2)$$

where $V_{BE}$ is a base-emitter voltage of the output transistor $Q_0$. Further, $$V_{OH} = -\frac{I_{OH}}{H_{FE}} \cdot R_2 - V_{BE} \quad (3)$$

where $H_{FE}$ is a direct current amplification factor of the transistor $Q_0$. From Equations (1) and (3) is given $$V_{OH} = \frac{V_{TT} - V_{OH}}{H_{FE}} \cdot \frac{R_2}{R_E} - V_{BE} \quad (4)$$

Equation (4) is arranged into $$V_{OH} = \frac{R_2 \cdot V_{TT} - V_{BE} \cdot R_E \cdot H_{FE}}{R_2 + H_{FE} \cdot R_E} \quad (5)$$

From FIG. 5 is found that the potential $V_{OH}$ rises toward $-V_{BE}$ (=−0.85 V) as the resistance of the resistor $R_2$ decreases and the potential $V_{OH}$ drops toward the potential $V_{TT}$ (=−2.0 V) as the resistance of the resistor $R_2$ increases. To set the potential $V_{OH}$ to about −0.9 V, a smaller resistance of the resistor $R_2$ is desirable.

FIG. 18 is a circuit diagram of an equivalent circuit including the output transistor $Q_0$ and adjacent components when "L" is applied to the base of the transistor $Q_1$ and the transistor $Q_1$ turns off while the transistor $Q_2$ turns on. Current $I_{OL}$ flowing through the output transistor $Q_0$ is expressed as:

$$I_{OL} = \frac{V_{OL} - V_{TT}}{R_E} \quad (6)$$

Since the transistor $Q_2$ is on, current $I_S$ fed from the current source $S_3$ as well as a base current $I_{BL}$ of the transistor $Q_0$ flows through the resistor $R_2$ connected to the base of the transistor $Q_0$. The potential $V_{OL}$ is $$V_{OL} = 0 - (I_{BL} + I_S) \cdot R_2 - V_{BE} \quad (7)$$

Similar to Equation (3), $$V_{OL} = -\left(\frac{I_{OL}}{H_{FE}} + I_S\right) \cdot R_2 - V_{BE} \quad (8)$$

From Equations (6) and (8) is given $$V_{OL} = -\left(\frac{V_{OL} - V_{TT}}{R_E \cdot H_{FE}} + I_S\right) \cdot R_2 - V_{BE} \quad (9)$$

Equation (9) is arranged into $$V_{OL} = -\frac{(I_S \cdot R_E \cdot H_{FE} - V_{TT}) \cdot R_2 + V_{BE} \cdot R_E \cdot H_{FE}}{R_2 + R_E \cdot H_{FE}} \quad (10)$$

From Equation (5) is found that a smaller resistance of the resistor $R_2$ is desirable. To set the potential $V_{OL}$ low (to −1.7 V), it is necessary to increase the current $I_S$.

As above described, large current $I_S$ is required to set the potential $V_{OH}$ high and the potential $V_{OL}$ low for achievement of ECL level specifications, resulting in a large amount of power consumption.

(A-2) Reduction in Operating Power

To solve the problem discussed in the previous section (A-1), the technique of varying the resistance of the resistor $R_2$ in response to on/off of the transistors $Q_1$ and $Q_2$ has been devised.

FIG. 19 is a circuit diagram of a current switch $G_{301}$ which is an example of the technique. Such a technique is disclosed in Japanese Patent Application Laid-Open No. 3-259617 (1991).

The current switch $G_{301}$ is constructed such that a PMOS transistor $P_3$ is connected in parallel with the resistor $R_2$ in the current switch $G_{30}$ of FIG. 16 and has a gate connected to the collector of the transistor $Q_1$.

The transistor $P_3$ turns off when "L" is applied to the base of the transistor $Q_1$ and the transistor $Q_1$ turns off whereas the transistor $Q_2$ turns on. The current switch $G_{301}$ is similar in operation to the current switch $G_{30}$.

The transistor $P_3$ turns on when "H" is applied to the base of the transistor $Q_1$ and the transistor $Q_1$ turns on whereas the transistor $Q_2$ turns off. Hence, the resistance of a resistor between the base of the output transistor $Q_0$ and the power supply GND in the current switch $G_{301}$ is lower than that in the current switch $G_{30}$. This means that the resistance $R_2$ in Equation (5) is substantially lower. Thus, the potential $V_{OH}$ to be calculated from Equation (5) can be high if the resistance $R_2$ is set high so that the potential $V_{OH}$ to be calculated from Equation (10) is lowered with the small current $I_S$. That is, the power consumption based on the current $I_S$ is suppressed.

In the current switch $G_{301}$, the on/off state of the transistor $P_3$ is controlled by differences in voltage drop in the resistor $R_1$ generated with on/off of the transistor $Q_1$. This presents the problem of low-speed operation left unsolved.

SUMMARY OF THE INVENTION

According to the present invention, an output buffer circuit comprises: (a) an input terminal receiving an input signal having a potential corresponding to one of binary logics "H" and "L" at a CMOS level; (b) a first level shifter for producing a first intermediate signal having a potential at an ECL level corresponding to a logic identical with the logic of the input signal; (c) a current switch including (c-1) a first voltage source for providing a constant potential, (c-2) a first current source for providing a constant current, (c-3) first and second resistors, (c-4) a first bipolar transistor having a collector connected to the first voltage source through the first resistor, an emitter connected to the first current source, and a base receiving the first intermediate signal, (c-5) a second bipolar transistor having a collector connected to the first voltage source through the second resistor, an emitter connected to the first current source, and a base receiving a reference potential, and (c-6) a first NMOS transistor having source and drain connected to opposite ends of the second resistor, and a gate receiving the input signal; and (d) an output bipolar transistor having a base connected to the collector of the second bipolar transistor, a collector connected to the first voltage source, and an emitter.

In the output buffer circuit of the present invention, the first NMOS transistor is off/on when the second bipolar transistor is on/off. When the second bipolar transistor is on, the first bipolar transistor is off, and accordingly the constant current from the first current source as well as the base current of the output bipolar transistor flows through the second resistor. Thus, setting of a high resistance of the second resistor reduces the collector potential of the second transistor if the constant current from the first current source is small. This permits the emitter potential of the output transistor to be lowered.

On the other hand, when the second bipolar transistor is off, the first bipolar transistor is on, and accordingly only current flowing through the base of the output transistor flows through the parallel connection of the second resistor and the on-resistance of the first NMOS transistor. When the collector of the output bipolar transistor is connected to a terminating power supply through a terminating resistor, the current fed from the output transistor causes a voltage drop in the terminating resistor, and the emitter potential of the output transistor is supported. Since the first NMOS transistor is on at this time, the base potential of the output transistor is raised and the current fed by the output transistor increases, thereby raising the emitter potential of the output transistor.

In the output buffer circuit of the present invention, the potential at the ECL level is provided at the emitter of the output transistor if the first current source flows small current. On/off operation of the first NMOS transistor which is controlled by the input signal having the CMOS level potential is performed at high speeds.

Preferably, the first level shifter includes: (b-1) an inverter receiving the input signal for producing a second intermediate signal having a logic complementary to the logic of the input signal; (b-2) a first PMOS transistor having a gate receiving the second intermediate signal, a source, and a drain; (b-3) a third resistor connected between the drain and source of the first PMOS transistor in parallel therewith; (b-4) a fourth resistor; (b-5) a first diode having a cathode, and an anode connected to the first voltage source; and (b-6) a second current source connected to the base of the first bipolar transistor for feeding a constant current, and parallel connection of the first PMOS transistor and the third resistor, the fourth resistor, and the first diode are connected in series between the first voltage source and the second current source.

In the output buffer circuit, when the input signal is the logic "H", the second intermediate signal is the logic "L" and the first PMOS transistor is on. Most of the current fed from the second current source passes through only the fourth resistor and the first PMOS transistor, in which a small voltage drop occurs. Thus, the first intermediate signal has a high potential corresponding to the logic "H".

On the other hand, when the input signal is the logic "L", the second intermediate signal is the logic "H" and the first PMOS transistor is off. The current fed from the second current source flows through the third and fourth resistors, in which a large voltage drop occurs. Thus, the first intermediate signal has a low potential corresponding to the logic "L".

Level shifting by using the first diode as well as the resistors requires a smaller area than level shifting by using only the resistors. In-series connection of the first diode and the third resistor allows the positive temperature coefficient of the third resistor and the negative temperature coefficient of the first diode to cancel each other.

Further, the first level shifter which includes no emitter-follower circuit may comprise the single current source.

In the output buffer circuit, the dependence of the operation of the output buffer circuit upon temperatures is reduced. The number of current sources is reduced and power consumption is suppressed.

Preferably, the inverter includes: (b-1-1) a second voltage source for providing a potential lower than the potential of the first voltage source; (b-1-2) a second PMOS transistor having a source connected to the first voltage source, a gate connected to the input terminal, and a drain; (b-1-3) a second NMOS transistor having a source connected to the second voltage source, a gate connected to the input terminal, and a drain; and (b-1-4) a second diode having an anode connected to the drain of the second PMOS transistor, and a cathode connected to the drain of the second NMOS transistor, and the second intermediate signal is outputted from the anode of the second diode.

In the output buffer circuit, the second PMOS transistor and the second NMOS transistor form the CMOS inverter which inverts the logic of the input signal to output the inverted logic. At this time, the second diode makes the "L" output higher than the potential of the second voltage source.

Since the output at the "L" level of the second intermediate signal is made higher than the potential of the second voltage source, the ON to OFF transition of the first PMOS transistor is speeded up in response to the "L" to "H" transition of the second intermediate signal.

Preferably, the current switch further includes: (c-7) a third PMOS transistor having source and drain connected to the opposite ends of the second resistor, and a gate connected to the collector of the first bipolar transistor.

In the output buffer circuit, when the first intermediate signal changes from "L" to "H", the first bipolar transistor turns on and the current flowing through the first resistor increases, thereby increasing a voltage drop in the first resistor. Thus, the gate potential of the third PMOS transistor drops and the third PMOS transistor turns on.

When the first bipolar transistor turns on, the on-resistance of the first NMOS transistor and the on-resistance of the third PMOS transistor are connected in parallel with the second resistor. This facilitates raising the emitter potential of the output transistor.

Preferably, the output buffer circuit further comprises (e) a second level shifter including: (e-1) a fourth PMOS transistor having a gate receiving the input signal, a source connected to the first voltage source, and a drain; (e-2) a fifth resistor connected between the drain and source of the fourth PMOS transistor in parallel therewith; (e-3) a sixth resistor having a first end, and a second end connected to the drain of the fourth PMOS transistor; (e-4) a third diode having a cathode applying the reference potential to the current switch, and an anode connected to the first end of the sixth resistor; and (e-5) a third current source connected to the cathode of the third diode for feeding a constant current.

In the output buffer circuit, the second level shifter inverts the logic of the input signal having the CMOS level potential to provide the reference potential at the ECL level. The first intermediate signal having the same logic as the input signal is applied to the first bipolar transistor whereas the reference potential having the logic complementary to the logic of the input signal is applied to the second bipolar transistor.

The first intermediate signal and the reference potential which transition in opposite directions are applied to the current switch during the transition of the input signal. This permits high-speed operation of the current switch.

According to another aspect of the present invention, an output buffer circuit comprises: (a) an input terminal receiving an input signal having a potential corresponding to one of binary logics "H" and "L" at a CMOS level; (b) a current switch including (b-1) a first voltage source for providing a constant potential, (b-2) a first current source for providing a constant current, (b-3) first and second resistors, (b-4) a first bipolar transistor having a collector connected to the first voltage source through the first resistor, an emitter connected to the first current source, and a base receiving a first intermediate signal, (b-5) a second bipolar transistor having a collector connected to the first voltage source through the second resistor, an emitter connected to the first current source, and a base receiving a second intermediate signal, and (b-6) a first NMOS transistor having source and drain connected to opposite ends of the second resistor, and a gate receiving the input signal; (c) an intermediate signal generator circuit receiving the input signal for producing the first and second intermediate signals, the first intermediate signal being higher in potential than the second intermediate signal when the logic of the input signal is "H", the first intermediate signal being lower in potential than the second intermediate signal when the logic of the input signal is "L"; and (d) an output bipolar transistor having a base connected to the collector of the second bipolar transistor, a collector connected to the first voltage source, and an emitter.

In the output buffer circuit of the second aspect of the present invention, the first NMOS transistor is off/on when the second bipolar transistor is on/off. When the input signal presents the logic "L", the second intermediate potential is higher than the first intermediate potential, and the second bipolar transistor is on whereas the first bipolar transistor is off. The constant current from the first current source as well as the base current of the output bipolar transistor flows through the second resistor. Thus, setting of a high resistance of the second resistor reduces the collector potential of the second transistor if the constant current from the first current source is small. This permits the emitter potential of the output transistor to be lowered.

On the other hand, when the input signal presents the logic "H", the first intermediate potential is higher than the second intermediate potential, and the first bipolar transistor is on whereas the second bipolar transistor is off. Only current flowing through the base of the output transistor flows through the parallel connection of the second resistor and the on-resistance of the first NMOS transistor. When the collector of the output bipolar transistor is connected to the terminating power supply through the terminating resistor, the current fed from the output transistor causes a voltage drop in the terminating resistor, and the emitter potential of the output transistor is supported. Since the first NMOS transistor is on at this time, the base potential of the output transistor is raised and the current fed by the output transistor increases, thereby raising the emitter potential of the output transistor.

In the output buffer circuit of the second aspect of the present invention, the potential at the ECL level is provided at the emitter of the output transistor if the first current source flows small current. On/off operation of the first NMOS transistor which is controlled by the input signal having the CMOS level potential is performed at high speeds.

Preferably, the intermediate signal generator circuit includes: (c-1) a first switch having first and second ends, the first and second ends of the first switch being non-connected when the logic of the input signal is "H", the first and second ends of the first switch being connected when the logic of the input signal is "L"; (c-2) a third resistor connected between the first end of the first switch and the first voltage source; (c-3) a second current source for applying a constant current to the second end of the first switch; (c-4) a second switch having first and second ends, the first and second ends of the second switch being connected when the logic of the input signal is "H", the first and second ends of the second switch being non-connected when the logic of the input signal is "L"; (c-5) a fourth resistor connected between the first end of the second switch and the first voltage source; (c-6) a third current source for applying a constant current to the second end of the second switch; (c-7) a first diode having a cathode connected to the first end of the first switch, and an anode connected to the first end of the second switch; and (c-8) a second diode having an anode connected to the first end of the first switch, and a cathode connected to the first end of the second switch, and the first intermediate signal is outputted from the cathode of the first diode, and the second intermediate signal is outputted from the cathode of the second diode.

The first and second switches open and close in complementary relation. When the input signal presents the logic "H", the first switch is off whereas the second switch is on. Then there is a current flow through the first diode, and the second diode becomes non-conductive. Conversely, when the input signal presents the logic "L", the first switch is on whereas the second switch is off. Then there is a current flow through the second diode, and the first diode becomes non-conductive.

With the input signal "H", the potential of the first intermediate signal is higher than the potential of the second intermediate signal by the voltage supported by the first diode. With the input signal "L", the potential of the second intermediate signal is higher than the potential of the first intermediate signal by the voltage supported by the second diode.

Preferably, the intermediate signal generator circuit further includes: (c-9) a third diode between the first end of the third resistor and the first voltage source; and (c-10) a fourth diode between the first end of the fourth resistor and the first voltage source.

In-series connection of the third diode and the third resistor allows the positive temperature coefficient of the third resistor and the negative temperature coefficient of the third diode to cancel each other. In-series connection of the fourth diode and the fourth resistor allows the positive temperature coefficient of the fourth resistor and the negative temperature coefficient of the fourth diode to cancel each other.

The dependence of the operation of the output buffer circuit upon temperatures is reduced.

Preferably, the second and third current sources are one and the same.

In the output buffer circuit, the number of current paths is reduced, and the power consumption is suppressed.

Preferably, the first switch includes (c-1-1) a second NMOS transistor having a gate receiving a control signal having a logic complementary to the logic of the input signal, and drain and source connected to the first and second ends of the first switch, respectively, and the second switch includes (c-4-1) a PMOS transistor having a gate receiving the control signal, and drain and source connected to the first and second ends of the second switch, respectively.

In the output buffer circuit, the same control signal is applied to the control electrodes of the MOS transistors having different conductivity types.

The first and second switches open and close in complementary relation.

Preferably, the first switch includes (c-1-2) a second NMOS transistor having a gate receiving a control signal having a logic complementary to the logic of the input signal, and drain and source connected to the first and second ends of the first switch, respectively, the second switch includes (c-4-2) a third NMOS transistor having a gate receiving the control signal, and drain and source connected to the first and second ends of the second switch, respectively, and the intermediate signal generator circuit further includes (c-11) an inverter receiving the input signal for producing the control signal.

The complementary logics are applied to the gates of the second and third NMOS transistors, respectively.

Complementary opening and closing of the first and second switches are achieved.

Preferably, the intermediate signal generator circuit further includes: (c-12) a first PMOS transistor having a drain connected to the drain of the second NMOS transistor, a source connected to the source of the second NMOS transistor, and a gate receiving the input signal; and (c-13) a second PMOS transistor having a drain connected to the drain of the third NMOS transistor, a source connected to the source of the third NMOS transistor, and a gate receiving the control signal.

The second NMOS transistor and the first PMOS transistor form a transfer gate, and the third NMOS transistor and the second PMOS transistor form another transfer gate.

Production of the first and second intermediate signals by using the transfer gates suppresses transition delay of the first and second intermediate signals.

Preferably, the intermediate signal generator circuit includes: (c-1) a first switch having first and second ends, the first and second ends of the first switch being non-connected when the logic of the input signal is "H", the first and second ends of the first switch being connected when the logic of the input signal is "L"; (c-2) a third resistor connected between the first end of the first switch and the first voltage source; (c-3) a second current source for applying a constant current to the second end of the first switch; (c-4) a second switch having first and second ends, the first and second ends of the second switch being connected when the logic of the input signal is "H", the first and second ends of the second switch being non-connected when the logic of the input signal is "L"; (c-5) a fourth resistor connected between the first end of the second switch and the first voltage source; (c-6) a third current source for applying a constant current to the second end of the second switch; and (c-7) a potential determining resistor between the first end of the first switch and the first end of the second switch.

In the output buffer circuit, the first and second switches open and close in complementary relation. When the input signal presents the logic "H", the first switch is off and the second switch is on. Then, current flows in the potential determining resistor from the first end of the first switch to the second end of the second switch. Conversely, when the input signal presents the logic "L", the first switch is on and the second switch is off. Then, current flows from the first end of the second switch to the second end of the first switch.

With the input signal "H", the potential of the first intermediate signal is higher than the potential of the second intermediate signal by the voltage drop in the potential determining resistor. With the input signal "L", the potential of the second intermediate signal is higher than the potential of the first intermediate signal by the voltage drop in the potential determining resistor.

According to a third aspect of the present invention, an output buffer circuit comprises: (a) an input terminal receiving an input signal having a potential corresponding to one of binary logics "H" and "L" at a CMOS level; (b) a CMOS inverter for inverting the logic applied to the input terminal; (c) a first level shifter for producing a first intermediate signal having a potential at an ECL level corresponding to a logic identical with the logic of an output from the CMOS inverter; (d) a current switch including (d-1) a first voltage source for providing a constant potential, (d-2) a first current source for providing a constant current, (d-3) first and second resistors, (d-4) a first bipolar transistor having a collector connected to the first voltage source through the first resistor, an emitter connected to the first current source, and a base receiving the first intermediate signal, (d-5) a second bipolar transistor having a collector connected to the first voltage source through the second resistor, an emitter connected to the first current source, and a base receiving a reference potential, and (d-6) a first PMOS transistor having source and drain connected to opposite ends of the first resistor, and a gate receiving the output from the CMOS inverter; and (e) an output bipolar transistor having a base connected to the collector of the first bipolar transistor, a collector connected to the first voltage source, and an emitter.

In the output buffer circuit of the third aspect of the present invention, the first PMOS transistor is off/on when the first bipolar transistor is on/off. When the first bipolar transistor is on, the second bipolar transistor is off, and accordingly the constant current from the first current source as well as the base current of the output bipolar transistor flows through the first resistor. Thus, setting of a high resistance of the first resistor reduces the collector potential of the first transistor if the constant current from the first current source is small. This permits the emitter potential of the output transistor to be lowered.

On the other hand, when the first bipolar transistor is off, the second bipolar transistor is on, and accordingly only current flowing through the base of the output transistor flows through the parallel connection of the first resistor and the on-resistance of the first PMOS transistor. When the collector of the output bipolar transistor is connected to the terminating power supply through the terminating resistor, the current fed from the output transistor causes a voltage drop in the terminating resistor, and the emitter potential of the output transistor is supported. Since the first PMOS transistor is on at this time, the base potential of the output transistor is raised and the current fed by the output transistor increases, thereby raising the emitter potential of the output transistor.

Further, the CMOS inverter shapes the waveform of the input signal.

In the output buffer circuit of the third aspect of the present invention, the potential at the ECL level is provided at the emitter of the output transistor if the first current source flows small current. On/off operation of the first PMOS transistor which is controlled by the CMOS level potential is performed at high speeds. Further, the waveform shaping of the input signal suppresses malfunctions.

Preferably, the first level shifter includes: (c-1) an inverter receiving the output from the CMOS inverter for producing a second intermediate signal complementary to the output from the CMOS inverter; (c-2) a second PMOS transistor having a gate receiving the second intermediate signal, a source, and a drain; (c-3) a third resistor connected between the drain and source of the second PMOS transistor in parallel therewith; (c-4) a fourth resistor; (c-5) a first diode having a cathode, and an anode connected to the first voltage source; and (c-6) a second current source connected to the base of the first bipolar transistor for feeding a constant current, and parallel connection of the second PMOS transistor and the third resistor, the fourth resistor, and the first diode are connected in series between the first voltage source and the second current source. In the output buffer circuit, when the input signal is the logic "L", the second intermediate signal is the logic "L" and the second PMOS transistor is on. Most of the current supplied from the second current source passes through only the fourth resistor and the second PMOS transistor, in which a small voltage drop occurs. Thus, the first intermediate signal has a high potential corresponding to the logic "H".

On the other hand, when the input signal is the logic "H", the second intermediate signal is the logic "H" and the second PMOS transistor is off. The current supplied from the second current source flows through the third and fourth resistors, in which a large voltage drop occurs. Thus, the first intermediate signal has a low potential corresponding to the logic "L".

Level shifting using the first diode as well as the resistors requires a smaller area than level shifting using only the resistors. In-series connection of the first diode and the third resistor allows the positive temperature coefficient of the third resistor and the negative temperature coefficient of the first diode to cancel each other.

Further, the first level shifter which includes no emitter-follower circuit may comprise the single current source.

The dependence of the operation of the output buffer circuit upon temperatures is reduced. The number of current sources is reduced and the power consumption is suppressed.

Preferably, the inverter includes: (c-1-1) a second voltage source for providing a potential lower than the potential of the first voltage source; (c-1-2) a third PMOS transistor having a source connected to the first voltage source, a gate connected to the input terminal, and a drain; (c-1-3) a first NMOS transistor having a source connected to the second voltage source, a gate connected to the input terminal, and a drain; and (c-1-4) a second diode having an anode connected to the drain of the third PMOS transistor, and a cathode connected to the drain of the first NMOS transistor, and the second intermediate signal is outputted from the anode of the second diode.

In the output buffer circuit, the first PMOS transistor and the third NMOS transistor form the CMOS inverter which inverts the logic of the input signal to output the inverted logic. At this time, the second diode makes the "L" level output higher than the potential of the second voltage source.

Since the output at the "L" level of the second intermediate signal is made higher than the potential of the second voltage source, the ON to OFF transition of the second PMOS transistor is speeded up in response to the "L" to "H" transition of the second intermediate signal.

Preferably, the current switch further includes: (d-7) a fourth PMOS transistor having source and drain connected to the opposite ends of the first resistor, and a gate connected to the collector of the second bipolar transistor.

When the first intermediate signal changes from "H" to "L", the second bipolar transistor turns on. Current flowing through the second resistor increases and the voltage drop in the second resistor increases. Thus the gate potential of the fourth PMOS transistor drops and the fourth PMOS transistor turns on.

When the second bipolar transistor turns on, the on-resistance of the fourth PMOS transistor as well as the on-resistance of the first PMOS transistor is connected in parallel with the first resistor. This facilitates raising the emitter potential of the output transistor.

Preferably, the output buffer circuit further comprises (f) a second level shifter including: (f-1) a fifth PMOS transistor having a gate receiving the output from the CMOS inverter, a source connected to the first voltage source, and a drain; (f-2) a fifth resistor connected between the drain and source of the fifth PMOS transistor in parallel therewith; (f-3) a sixth resistor having a first end, and a second end connected to the drain of the fifth PMOS transistor; (f-4) a third diode having a cathode applying the reference potential to the current switch, and an anode connected to the first end of the sixth resistor; and (f-5) a third current source connected to the cathode of the third diode for feeding a constant current.

In the output buffer circuit, the second level shifter inverts the logic of the output from the CMOS inverter to provide the reference potential at the ECL level. The first intermediate signal having the logic complementary to the logic of the input signal is applied to the first bipolar transistor, and the reference potential having the same logic as the input signal is applied to the second bipolar transistor.

The first intermediate signal and the reference potential which transition in opposite directions are applied to the current switch during the transition of the input signal. This permits high-speed operation of the current switch.

According to a fourth aspect of the present invention, an output buffer circuit comprises: (a) an input terminal receiving an input signal having a potential corresponding to one of binary logics "H" and "L" at a CMOS level; (b) a CMOS inverter for inverting the logic applied to the input terminal; (c) a current switch including (c-1) a first voltage source for providing a constant potential, (c-2) a first current source for providing a constant current, (c-3) first and second resistors, (c-4) a first bipolar transistor having a collector connected to the first voltage source through the first resistor, an emitter connected to the first current source, and a base receiving a first intermediate signal, (c-5) a second bipolar transistor having a collector connected to the first voltage source through the second resistor, an emitter connected to the first current source, and a base receiving a second intermediate signal, and (c-6) a first PMOS transistor having source and drain connected to opposite ends of the first resistor, and a gate receiving an output from the CMOS inverter; (d) an intermediate signal generator circuit receiving the output from the CMOS inverter for producing the first and second intermediate signals, the first intermediate signal being higher in potential than the second intermediate signal when the logic of the output from the CMOS inverter is "H", the first intermediate signal being lower in potential than the second intermediate signal when the logic of the output from the CMOS inverter is "L"; and (e) an output bipolar transistor having a base connected to the collector of the first bipolar transistor, a collector connected to the first voltage source, and an emitter.

In the output buffer circuit of the fourth aspect of the present invention, the first PMOS transistor is off/on when the first bipolar transistor is on/off. When the input signal presents the logic "L", the first intermediate potential is higher than the second intermediate potential, and the first bipolar transistor is on whereas the second bipolar transistor is off. The constant current from the first current source as well as the base current of the output bipolar transistor flows through the first resistor. Thus, setting of a high resistance of the first resistor reduces the collector potential of the first transistor if the constant current from the first current source is small. This permits the emitter potential of the output transistor to be lowered.

On the other hand, when the input signal presents the logic "H", the second intermediate potential is higher than the first intermediate potential, and the second bipolar transistor is on whereas the first bipolar transistor is off. Only current flowing through the base of the output transistor flows through the parallel connection of the first resistor and the on-resistance of the first PMOS transistor. When the collector of the output bipolar transistor is connected to the terminating power supply through the terminating resistor, the current fed from the output transistor causes a voltage drop in the terminating resistor, and the emitter potential of the output transistor is supported. Since the first PMOS transistor is on at this time, the base potential of the output transistor is raised and the current fed by the output transistor increases, thereby raising the emitter potential of the output transistor.

In the output buffer circuit of the fourth aspect of the present invention, the potential at the ECL level is provided at the emitter of the output transistor if the first current source flows small current. On/off operation of the first PMOS transistor which is controlled by the CMOS inverter is performed at high speeds.

Preferably, the intermediate signal generator circuit includes: (d-1) a first switch having first and second ends, the first and second ends of the first switch being non-connected when the logic of the output from the CMOS inverter is "H", the first and second ends of the first switch being connected when the logic of the output from the CMOS inverter is "L"; (d-2) a third resistor connected between the first end of the first switch and the first voltage source; (d-3) a second current source for applying a constant current to the second end of the first switch; (d-4) a second switch having first and second ends, the first and second ends of the second switch being connected when the logic of the output from the CMOS inverter is "H", the first and second ends of the second switch being non-connected when the logic of the output from the CMOS inverter is "L"; (d-5) a fourth resistor connected between the first end of the second switch and the first voltage source; (d-6) a third current source for applying a constant current to the second end of the second switch; (d-7) a first diode having a cathode connected to the first end of the first switch, and an anode connected to the first end of the second switch; and (d-8) a second diode having an anode connected to the first end of the first switch, and a cathode connected to the first end of the second switch, and the first intermediate signal is outputted from the cathode of the first diode, and the second intermediate signal is outputted from the cathode of the second diode.

The first and second switches open and close in complementary relation. When the input signal presents the logic "H", the first switch is on whereas the second switch is off. Then there is a current flow through the second diode, and the first diode becomes non-conductive. Conversely, when the input signal presents the logic "L", the first switch is off whereas the second switch is on. Then there is a current flow through the first diode, and the second diode becomes non-conductive.

With the input signal "L", the potential of the first intermediate signal is higher than the potential of the second intermediate signal by the voltage supported by the first diode. With the input signal "H", the potential of the second intermediate signal is higher than the potential of the first intermediate signal by the voltage supported by the second diode.

Preferably, the first switch includes (d-1-1) an NMOS transistor having a gate receiving a control signal having a logic complementary to the logic of the output from the CMOS inverter, and drain and source connected to the first and second ends of the first switch, respectively, and the second switch includes (d-4-1) a second PMOS transistor having a gate receiving the control signal, and drain and source connected to the first and second ends of the second switch, respectively.

The same control signal is applied to the control electrodes of the MOS transistors of different conductivity type. The first and second switches open and close in complementary relation.

Preferably, the first switch includes (d-1-2) a first NMOS transistor having a gate receiving a control signal having a logic complementary to the logic of the input signal, and drain and source connected to the first and second ends of the first switch, respectively, the second switch includes (d-4-2) a second NMOS transistor having a gate receiving the control signal, and drain and source connected to the first and second ends of the second switch, respectively, and the intermediate signal generator circuit further includes (d-9) an inverter receiving the input signal for producing the control signal.

The complementary logics are applied to the gates of the first and second NMOS transistors, respectively. Complementary opening and closing of the first and second switches are accomplished.

Preferably, the intermediate signal generator circuit further includes: (d-10) a second PMOS transistor having a drain connected to the drain of the first NMOS transistor, a source connected to the source of the first NMOS transistor, and a gate receiving the output from the CMOS inverter; and (d-11) a third PMOS transistor having a drain connected to the drain of the second NMOS transistor, a source connected to the source of the second NMOS transistor, and a gate receiving the control signal.

The first NMOS transistor and the second PMOS transistor form a transfer gate, and the second NMOS transistor and the third PMOS transistor form another transfer gate.

Production of the first and second intermediate signals by using the transfer gates suppresses delays between the first and second intermediate signals.

Preferably, the intermediate signal generator circuit includes: (d-1) a first switch having first and second ends, the first and second ends of the first switch being non-connected when the logic of the input signal is "H", the first and second ends of the first switch being connected when the logic of the input signal is "L"; (d-2) a third resistor connected between the first end of the first switch and the first voltage source; (d-3) a second current source for applying a constant current to the second end of the first switch; (d-4) a second switch having first and second ends, the first and second ends of the second switch being connected when the logic of the input signal is "H", the first and second ends of the second switch being non-connected when the logic of the input signal is "L"; (d-5) a fourth resistor connected between the first end of the second switch and the first voltage source; (d-6) a third current source for applying a constant current to the second end of the second switch; and (d-7) a potential determining resistor between the first end of the first switch and the first end of the second switch.

In the output buffer circuit, the first and second switches open and close in complementary relation. When the input signal presents the logic "L", the first switch is off and the second switch is on. Then current flows in the potential determining resistor from the first end of the first switch to the second end of the second switch. Conversely, when the input signal presents the logic "H", the first switch is on and the second switch is off. Then current flows in the potential determining resistor from the first end of the second switch to the second end of the first switch.

With the input signal "L", the potential of the first intermediate signal is higher than the potential of the second intermediate signal by the voltage drop in the potential determining resistor. With the input signal "H", the potential of the second intermediate signal is higher than the potential of the first intermediate signal by the voltage drop in the potential determining resistor.

It is therefore an object of the present invention to provide an output buffer circuit which operates at high speeds with suppressed power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

B. First Feature

A first feature of the present invention provides an output buffer circuit wherein a transistor for receiving an intermediate signal given in response to an input signal and a transistor for controlling an output transistor are different, which will be described in detail in respective preferred embodiments.

(b-1) First Preferred Embodiment

Figure 1:
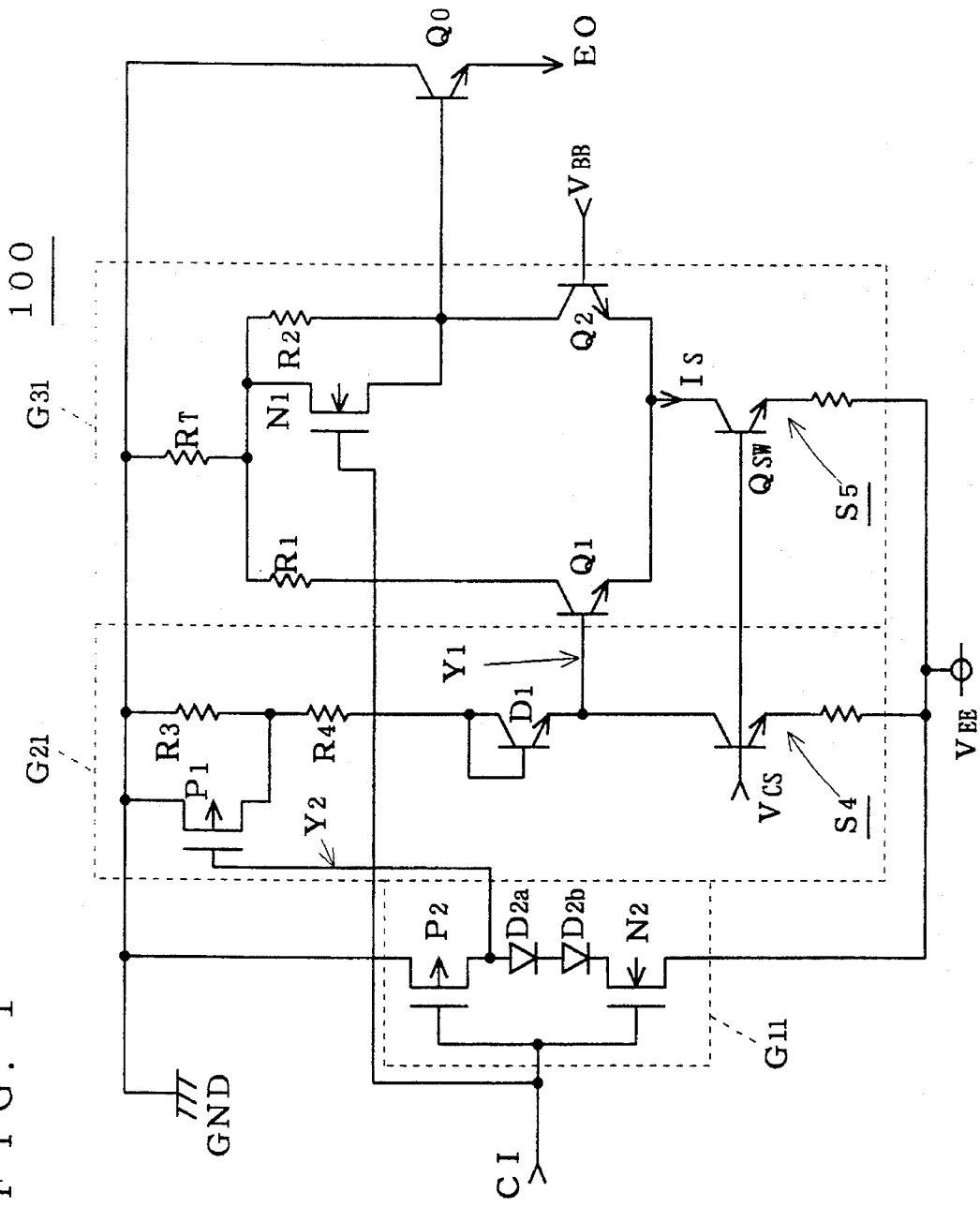
FIG. 1 is a circuit diagram of an output buffer circuit 100 according to a first preferred embodiment of the present invention.
Figure 15:
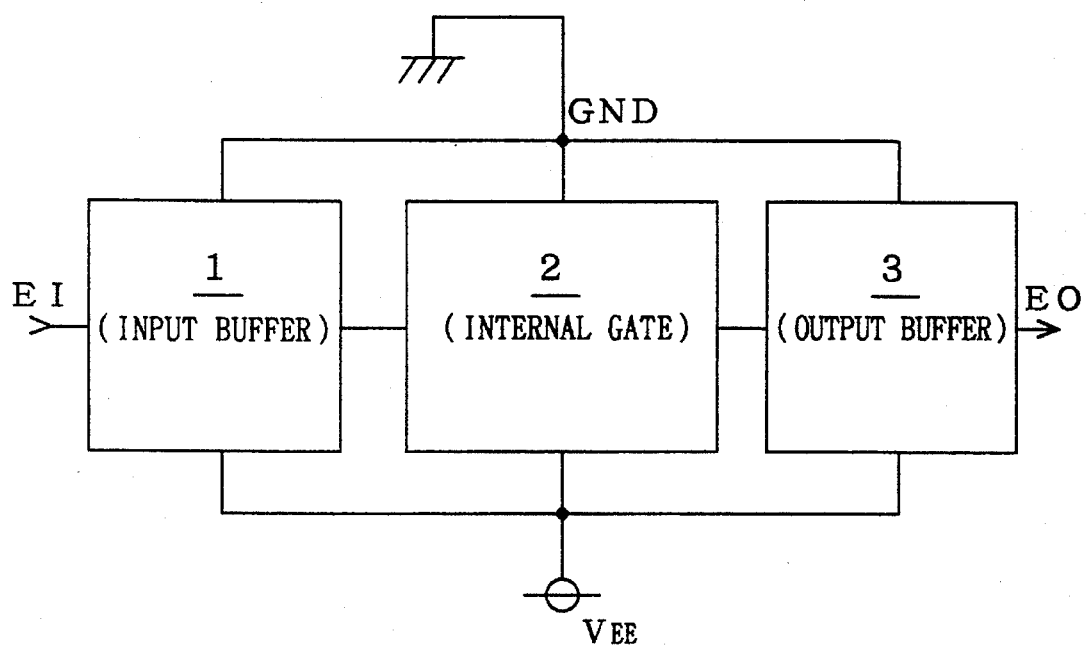
FIG. 15 is a block diagram of an LSI accomplishing ECL input and output.

FIG. 1 is a circuit diagram of an output buffer circuit 100 according to a first preferred embodiment of the present invention. The output buffer circuit 100 may be used as the output buffer circuit 3 of FIG. 15.

An input terminal receives an input signal CI having a potential corresponding to one of binary logics "H" and "L" at a CMOS level. An inverter $G_{11}$ is connected to the input terminal. The inverter $G_{11}$ and an inverter $G_{21}$ having a level shift function (referred to as a "level shift inverter" hereinafter) form a first level shifter for producing an intermediate signal $Y_1$ having an ECL level potential corresponding to the same logic as the input signal CI. The inverter $G_{11}$ produces an intermediate signal $Y_2$.

A current switch $G_{31}$ receives the intermediate signal $Y_1$ and a reference potential $V_{BB}$ and applies a signal of the same logic as the intermediate signal $Y_1$ to the base of an output transistor $Q_0$. The current switch $G_{31}$ includes resistors $R_1$ and $R_2$ connected to a power supply GND through a resistor $R_T$; an NPN bipolar transistor $Q_1$ having a collector connected to the power supply GND through the resistors $R_1$ and $R_T$, an emitter, and a base receiving the intermediate signal $Y_1$; and an NPN bipolar transistor $Q_2$ having a collector connected to the power supply GND through the resistors $R_2$ and $R_T$, an emitter, and a base receiving the reference potential $V_{BB}$. The emitters of the transistors $Q_1$ and $Q_2$ are commonly connected to a current source $S_5$. The current source $S_5$ is comprised of, for example, an NPN transistor $Q_{SW}$ having a base receiving a potential $V_{CS}$, and a resistor connected in series with the NPN transistor $Q_{SW}$.

The current switch $G_{31}$ further includes an NMOS transistor $N_1$ having source and drain connected to opposite ends of the resistor $R_2$ and a gate receiving the input signal CI.

The output transistor $Q_0$ has a collector connected to the power supply GND and an emitter providing an output signal EO.

The level shift inverter $G_{21}$ includes a PMOS transistor $P_1$ having a gate receiving the intermediate signal $Y_2$, a source connected to the power supply GND, and a drain. A resistor $R_3$ is connected between the drain and source of the PMOS transistor $P_1$ in parallel therewith. The drain of the PMOS transistor $P_1$ is connected to a current source $S_4$ through a resistor $R_4$ and a diode $D_1$.

The inverter $G_{11}$ includes a PMOS transistor $P_2$ having a source connected to the power supply GND, a gate connected to the input terminal, and a drain, and an NMOS transistor $N_2$ having a source connected to a power supply $V_{EE}$, a gate connected to the input terminal, and a drain. The inverter $G_{11}$ further includes diodes $D_{2a}$ and $D_{2b}$ connected in series and having an anode connected to the drain of the PMOS transistor $P_2$ and a cathode connected to the drain of the NMOS transistor $N_2$. The intermediate signal $Y_2$ is outputted from the anode of the diode $D_{2a}$.

In operation, when the input signal CI makes an "L" to "H" transition, the inverter $G_{11}$ causes the intermediate signal $Y_2$ to transition from "H" to "L". This turns on the PMOS transistor $P_1$. Since most of the current supplied from the current source $S_4$ passes through only the resistor $R_4$ and the PMOS transistor $P_1$, a voltage drop between the power supply GND and the diode $D_1$ is small. Thus, the intermediate signal $Y_1$ has a high potential corresponding to the logic "H".

When the input signal CI makes an "H" to "L" transition, the inverter $G_{11}$ causes the intermediate signal $Y_2$ to transition from "L" to "H". This turns off the PMOS transistor $P_1$. Current supplied from the current source $S_4$ flows through the resistors $R_3$ and $R_4$, and a voltage drop in the resistors $R_3$ and $R_4$ are large. Thus, the intermediate signal $Y_1$ has a low potential corresponding to the logic "L".

Then, the diodes $D_{2a}$ and $D_{2b}$ in the inverter $G_{11}$ cause the amplitude of the intermediate signal $Y_2$ to be $|V_{EE}|-2 V_{BE}$ ($V_{BE}$ is a forward direction voltage of the diodes $D_{2a}$, $D_{2b}$). Reduction in amplitude permits high-speed switching of the PMOS transistor $P_1$.

In this manner, the intermediate signal $Y_1$ is produced at the ECL level with the same logic as the input signal CI. Level shifting by means of the diode $D_1$ as well as the resistors $R_3$ and $R_4$ requires a smaller area than level shifting by means of only the resistors $R_3$ and $R_4$. In-series connection of the diode $D_1$ and the resistor $R_3$ allows a positive temperature coefficient of the resistor $R_3$ and a negative temperature coefficient of the diode $D_1$ to cancel each other, thereby reducing the dependence of operation of the output buffer circuit 100 upon temperatures.

Further, the level shift inverter $G_{21}$ which includes no background art emitter-follower circuit can comprise the single current source $S_4$. This reduces the number of current sources and suppresses power consumption.

Figure 18:
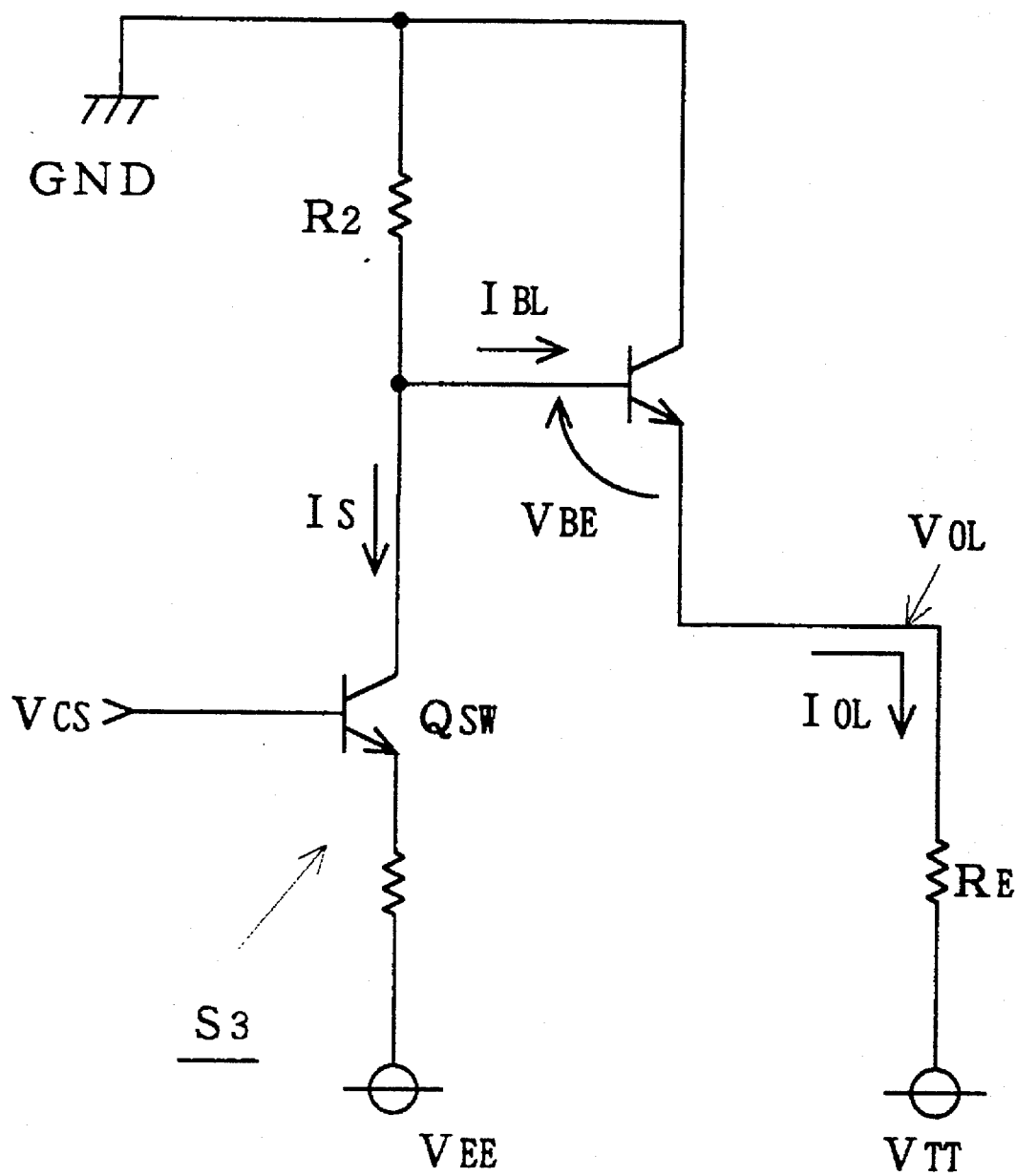
FIG. 18 is a circuit diagram of an equivalent circuit including the output transistor $Q_0$ and adjacent components when the transistors $Q_1$ and $Q_2$ are off and on, respectively.

Operation of the current switch $G_{31}$ will be described below. When the input signal CI makes the "H" to "L" transition, the logic of the intermediate signal $Y_1$ becomes "L". Then the transistor $Q_1$ turns off and the transistor $Q_2$ turns on. At this point of time, a constant current from the current source $S_5$ as well as the base current of the output transistor $Q_0$ flows through the resistor $R_2$ as shown in FIG. 18.

The potential corresponding to the logic "L" at the CMOS level has been applied to the gate of the NMOS transistor $N_1$, and the NMOS transistor $N_1$ turns off. The resistance of the resistor $R_2$ is increased in order to decrease the constant current from the current source $S_5$. This lowers the collector potential of the transistor $Q_2$ and accordingly lowers the emitter potential of the output transistor, providing the logic "L" of the output signal EO.

On the other hand, when the input signal CI makes the "L" to "H" transition, the logic of the intermediate signal $Y_1$ becomes "H". Then the transistor $Q_1$ turns on and the transistor $Q_2$ turns off. The input signal CI at the potential corresponding to the logic "H" at the CMOS level has been applied to the gate of the NMOS transistor $N_1$. Thus the NMOS transistor $N_1$ turns on.

Figure 17:
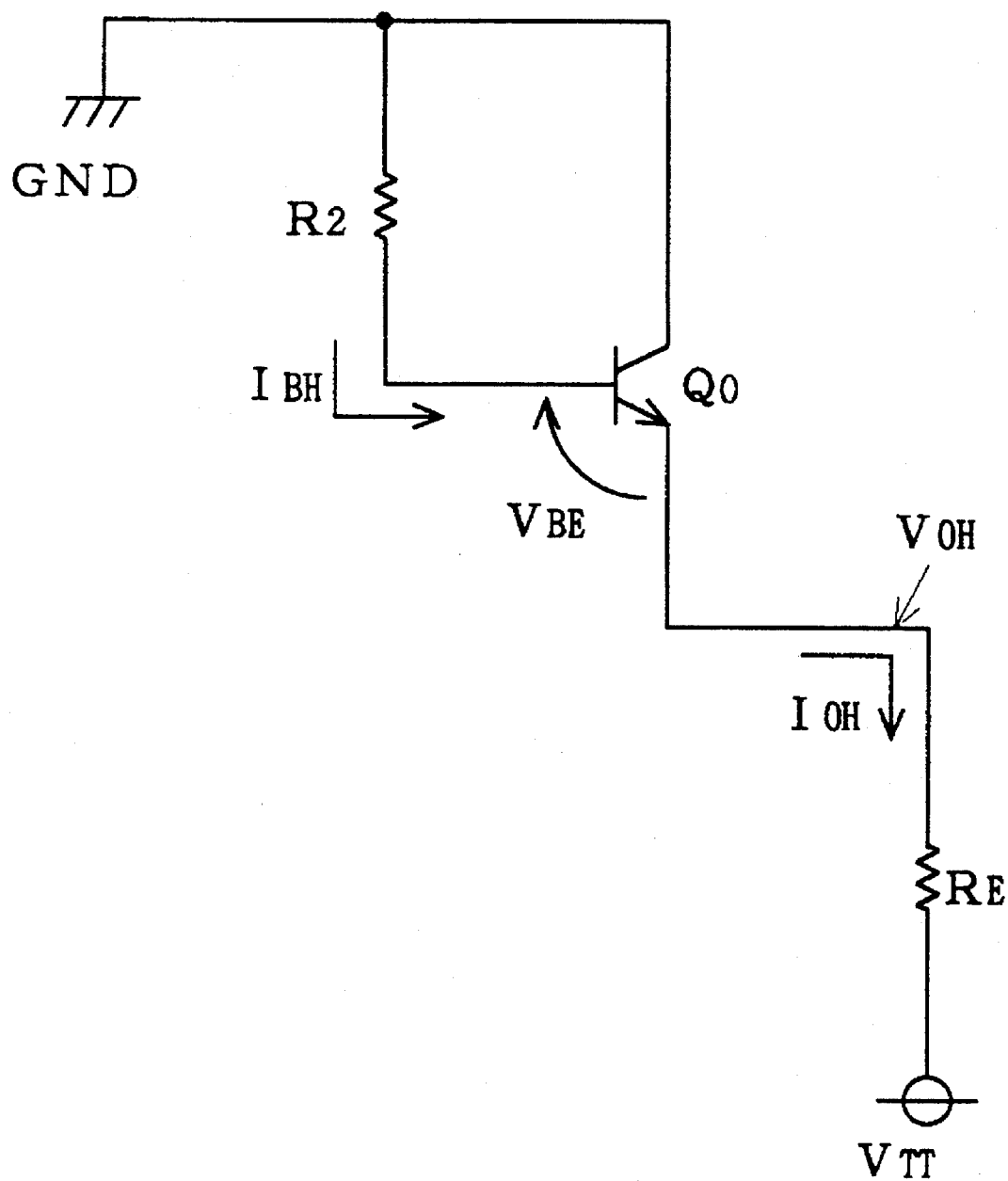
FIG. 17 is a circuit diagram of an equivalent circuit including an output transistor $Q_0$ and adjacent components when transistors $Q_1$ and $Q_2$ are on and off, respectively.

As the transistor $Q_1$ turns on, the transistor $Q_2$ turns off and only the base current of the output transistor $Q_0$ flows through the parallel connection of the resistor $R_2$ and the on-resistance of the NMOS transistor $N_1$. As shown in FIG. 17, when the collector of the output transistor $Q_0$ is connected to a terminating power supply $V_{TT}$ through a terminating resistor $R_E$, current fed from the output transistor $Q_0$ causes a voltage drop in the terminating resistor $R_E$, and the emitter potential of the output transistor $Q_0$ is supported. Since the NMOS transistor $N_1$ is on, the base potential of the output transistor $Q_0$ is raised if the resistor $R_2$ has an increased resistance, and the current fed by the output transistor $Q_0$ increases. The emitter potential of the output transistor $Q_0$ is also raised. Thus, the logic of the output signal EO becomes "H".

Figure 16:
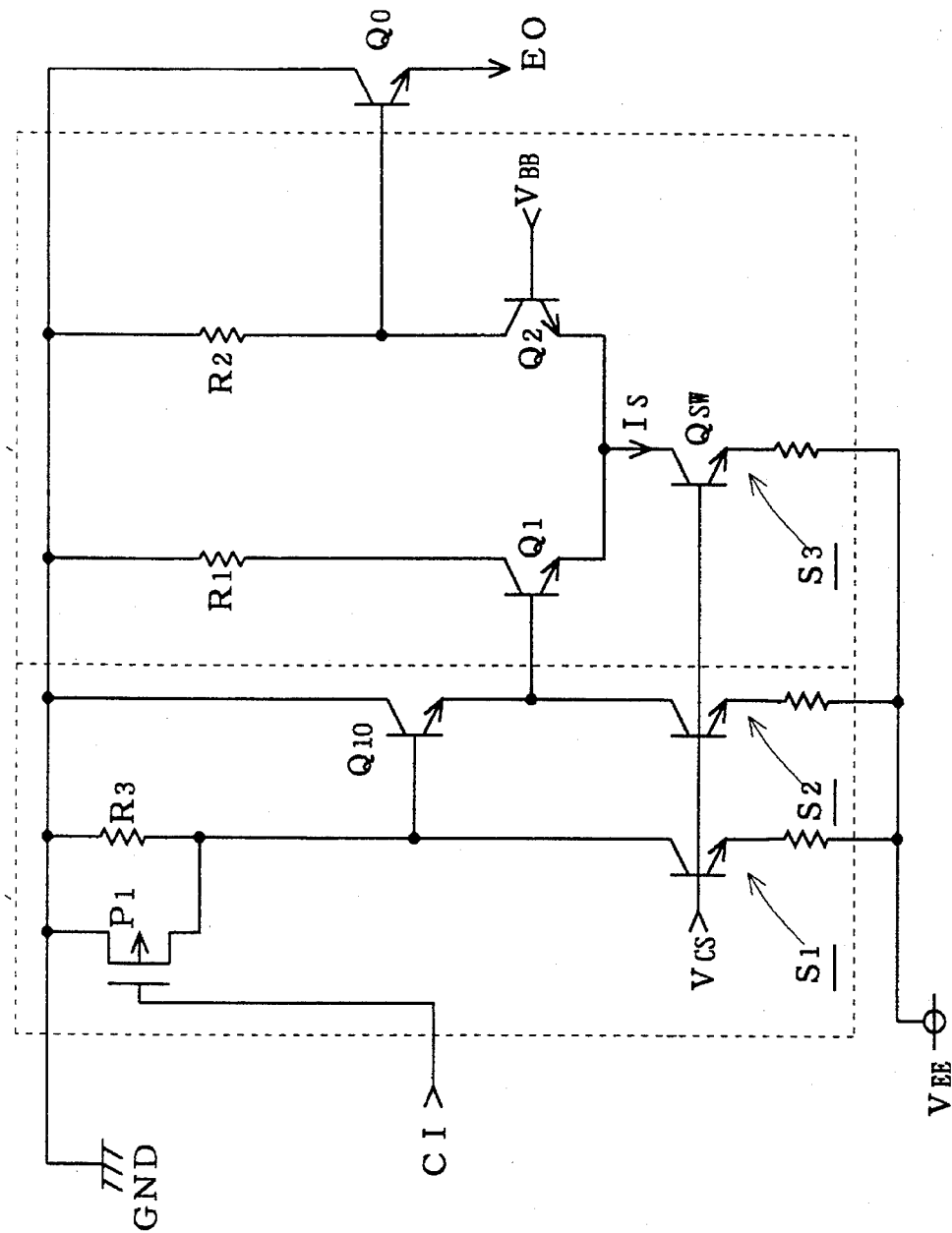
FIG. 16 is a circuit diagram of an output buffer circuit 3 of the background art.

In the output buffer circuit 3 of FIG. 16, it is necessary that $R_1+R_T$ is about 200Ω and the current $I_S$ fed by the current source $S_3$ is about 5 mA. In the output buffer circuit 100, however, the current $I_S$ fed by the current source $S_5$ may be reduced to 1 mA which is about one-fifth the background art current $I_S$. The resistor $R_T$ is effective at fine control of the characteristics of the output buffer circuit 100.

Figure 19:
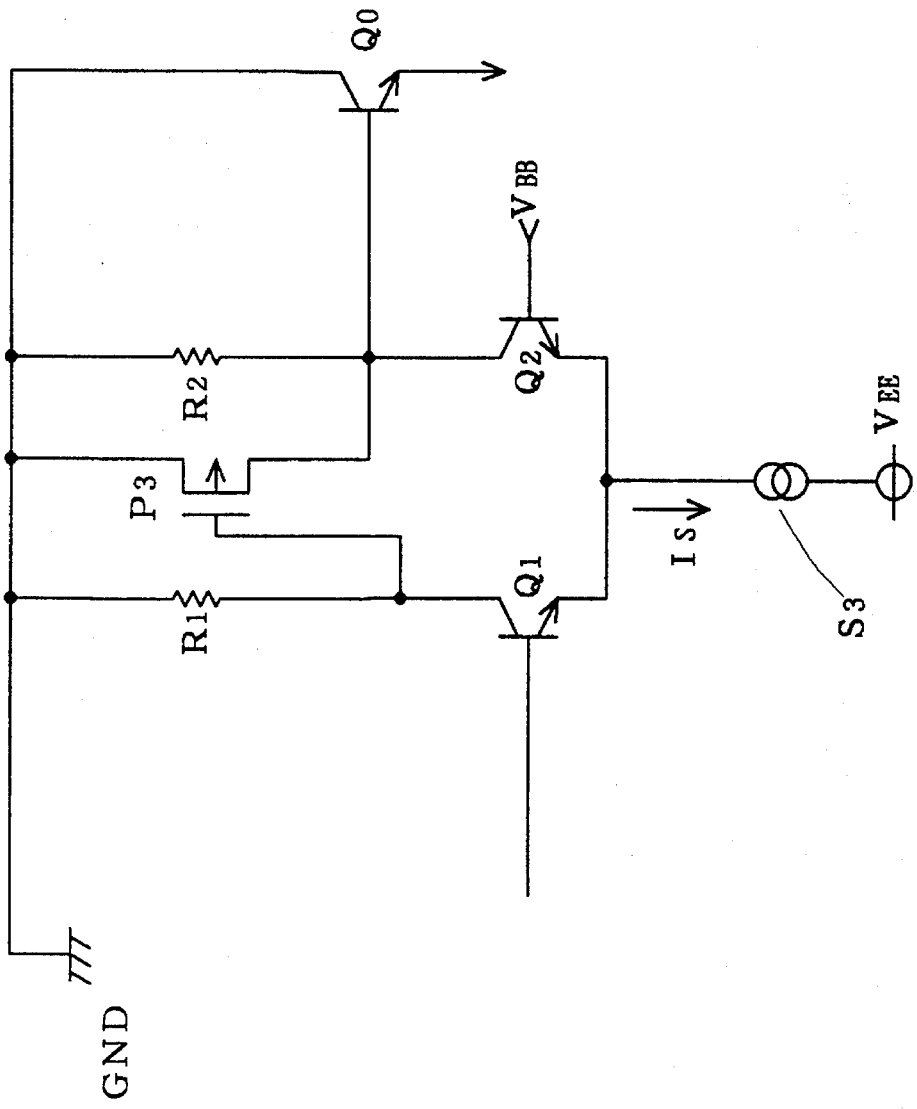
FIG. 19 is a circuit diagram of a current switch $G_{301}$ of the background art.

The NMOS transistor $N_1$ of the first preferred embodiment is identical in function with the PMOS transistor $P_3$ of the background art shown in FIG. 19. However, switching of the NMOS transistor $N_1$ is controlled by the CMOS level potential and accordingly has an advantage in its higher speed over the switching of the PMOS transistor $P_3$ controlled by the switching of the transistor $Q_1$.

(b-2) Second Preferred Embodiment

Figure 2:
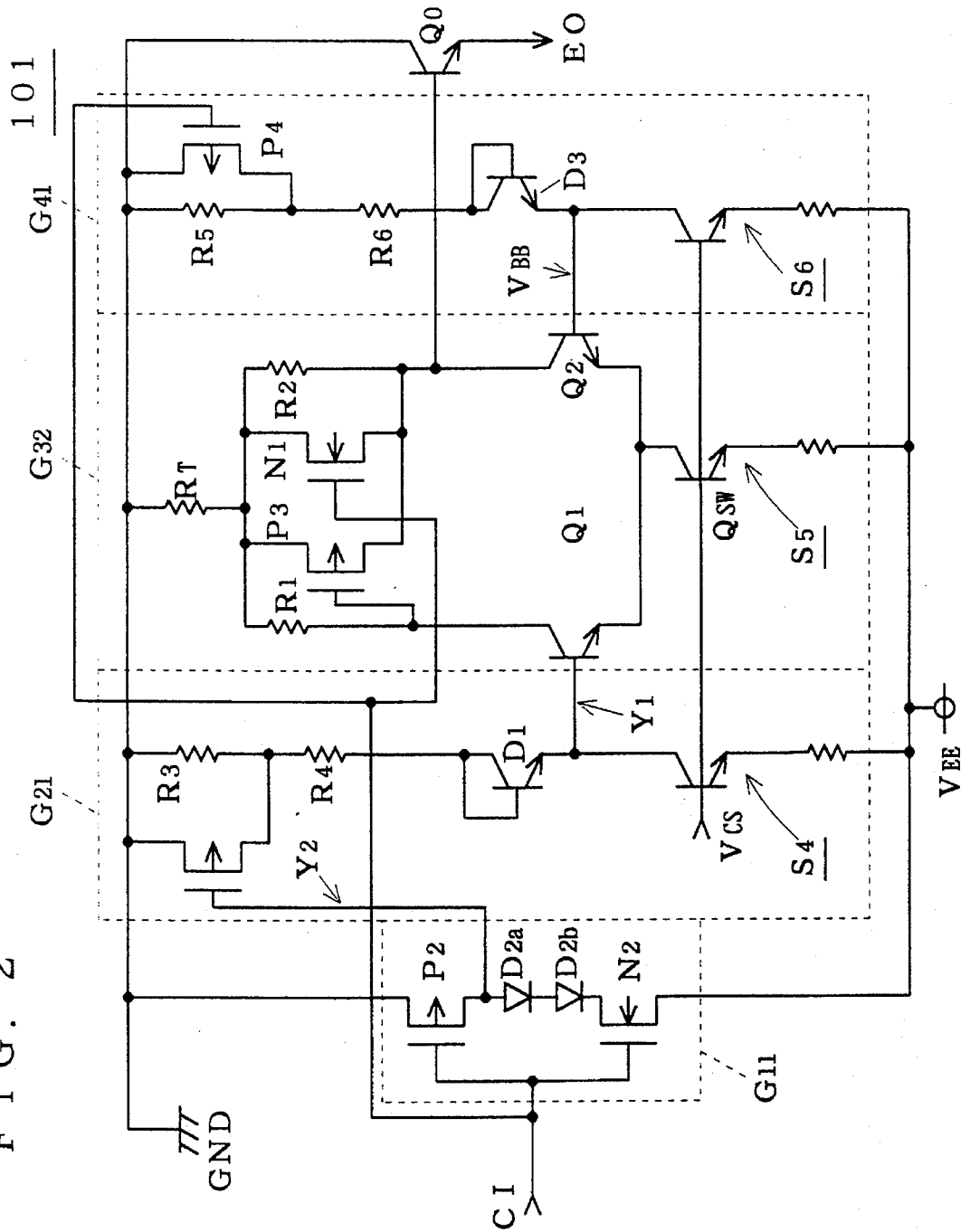
FIG. 2 is a circuit diagram of an output buffer circuit 101 according to a second preferred embodiment of the present invention.

FIG. 2 is a circuit diagram of an output buffer circuit 101 according to a second preferred embodiment of the present invention. The output buffer circuit 101 may be used as the output buffer circuit 3 of FIG. 15.

The output buffer circuit 101 is constructed such that a current switch $G_{32}$ is substituted for the current switch $G_{31}$ of the output buffer circuit 100 and a reference potential generator circuit $G_{41}$ for producing the reference potential $V_{BB}$ is added to the output buffer circuit 100.

The current switch $G_{32}$ is constructed such that a PMOS transistor $P_3$ is added to the current switch $G_{31}$. Similar to the background art current switch $G_{301}$, the PMOS transistor $P_3$ is connected in parallel with the resistor $R_2$ and has a gate connected to the collector of the transistor $Q_1$. Thus, the PMOS transistor $P_3$ operates in the same manner as the background art but exhibits the function of further raising the base potential of the transistor $Q_0$ when the transistor $Q_1$ is on in combination with the operation of the NMOS transistor $N_1$.

In the second preferred embodiment, the operation of the current switch $G_{32}$ is speeded up by transitioning the reference potential $V_{BB}$ in the opposite direction from the intermediate signal $Y_1$. The reference potential generator circuit $G_{41}$ produces such a reference potential $V_{BB}$. The reference potential generator circuit $G_{41}$ is a level shift inverter and is similar in construction to the level shift inverter $G_{21}$. That is, the reference potential generator circuit $G_{41}$ includes a PMOS transistor $P_4$ having a gate receiving the input signal CI, a source connected to the power supply GND, and a drain. A resistor $R_5$ is connected between the drain and source of the PMOS transistor $P_4$ in parallel therewith. The drain of the PMOS transistor $P_4$ is connected to a current source $S_6$ through a resistor $R_6$ and a diode $D_3$.

The intermediate signal $Y_2$ having the inversion of the logic of the input signal CI is applied to the level shift inverter $G_{21}$, and the input signal CI is applied to the reference potential generator circuit $G_{41}$. Thus, the intermediate signal $Y_1$ outputted from the level shift inverter $G_{21}$ and the reference potential $V_{BB}$ outputted from the reference potential generator circuit $G_{41}$ transition in opposite directions.

This eliminates the need for the conventionally separately formed reference potential generator circuits and provides a wider input margin of the current switch $G_{32}$, as well as permitting high-speed operation.

(b-3) Third Preferred Embodiment

Figure 3:
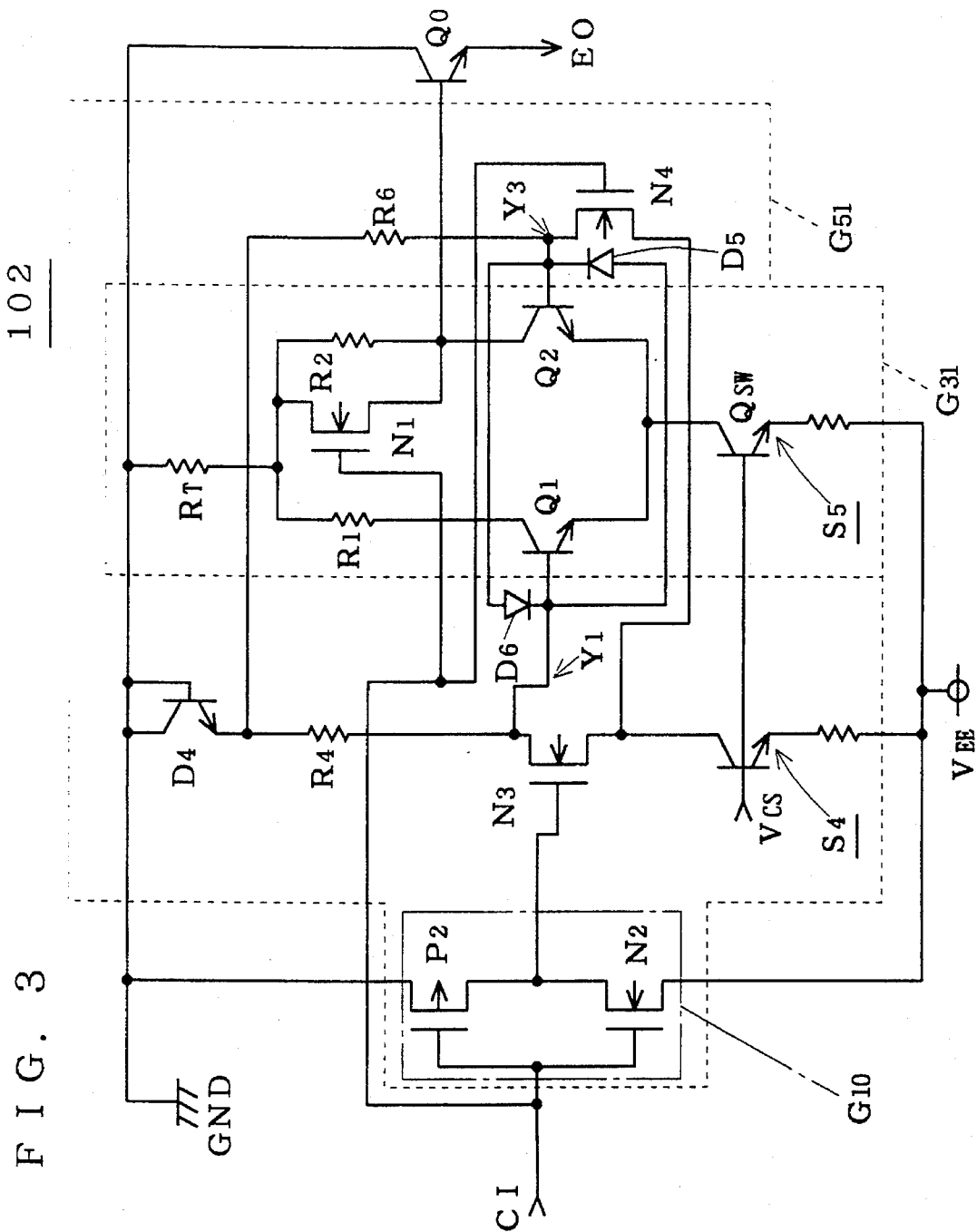
FIG. 3 is a circuit diagram of an output buffer circuit 102 according to a third preferred embodiment of the present invention.

FIG. 3 is a circuit diagram of an output buffer circuit 102 according to a third preferred embodiment of the present invention. Similar to the output buffer circuit 100, the output buffer circuit 102 comprises the current switch $G_{31}$. The output buffer circuit 102 further comprises an intermediate signal generator circuit $G_{51}$ for applying two intermediate signals $Y_1$ and $Y_3$ to the current switch $G_{31}$.

The intermediate signal generator circuit $G_{51}$ receives the input signal CI. The intermediate signal $Y_1$ presents a potential higher than that of the intermediate signal $Y_3$ when the logic of the input signal CI is "H" and presents a potential lower than that of the intermediate signal $Y_3$ when the logic of the input signal CI is "L".

Specifically, the intermediate signal generator circuit $G_{51}$ includes an inverter $G_{10}$ which receives and inverts the input signal CI to output the inversion thereof. The power supply GND is connected to the anode of a diode $D_4$, and the power supply $V_{EE}$ is connected to the current source $S_4$. The diode $D_4$ and the current source $S_4$ also function as the diode $D_3$ and the current source $S_6$ of the output buffer circuit 101, respectively. Reduction in the number of current paths allows current consumption in the output buffer circuit 102 to be suppressed more than that in the output buffer circuit 101.

The first ends of the resistors $R_4$ and $R_6$ are connected to the cathode of the diode $D_4$, and the second ends thereof are connected to the drains of NMOS transistors $N_3$ and $N_4$, respectively. The sources of the NMOS transistors $N_3$ and $N_4$ are connected to the power supply $V_{EE}$ through the current source $S_4$.

Diodes $D_5$ and $D_6$ are connected in inverse-parallel between the drains of the NMOS transistors $N_3$ and $N_4$ and have cathodes providing the intermediate signals $Y_1$ and $Y_3$, respectively.

When the input signal CI presents the logic "H", the NMOS transistor $N_4$ turns on, and the NMOS transistor $N_3$ turns off upon receipt of the potential indicative of the logic "L" at the CMOS level from the inverter $G_{10}$. Then, there is a current flow through the diode $D_5$, and the diode $D_6$ becomes non-conductive. Hence, when the input signal CI presents the logic "H", the potential of the intermediate signal $Y_1$ is higher than the potential of the intermediate signal $Y_3$ by the voltage supported by the diode $D_5$. The transistor $Q_1$ turns on and the transistor $Q_2$ turns off.

Conversely, when the input signal CI presents the logic "L", the NMOS transistor $N_4$ turns off, and the NMOS transistor $N_3$ turns on upon receipt of the potential indicative of the logic "H" at the CMOS level from the inverter $G_{10}$. Then, there is a current flow through the diode $D_6$, and the diode $D_5$ becomes non-conductive. Hence, when the input signal CI presents the logic "L", the potential of the intermediate signal $Y_3$ is higher than the potential of the intermediate signal $Y_1$ by the voltage supported by the diode $D_6$. The transistor $Q_1$ turns off and the transistor $Q_2$ turns on.

The current switch $G_{31}$ of the third preferred embodiment is similar in operation to that of the first preferred embodiment, and the third preferred embodiment provides effects similar to those of the first preferred embodiment. The third preferred embodiment which has fewer current paths than does the second preferred embodiment can further suppress power consumption.

(b-4) Fourth Preferred Embodiment

Figure 4:
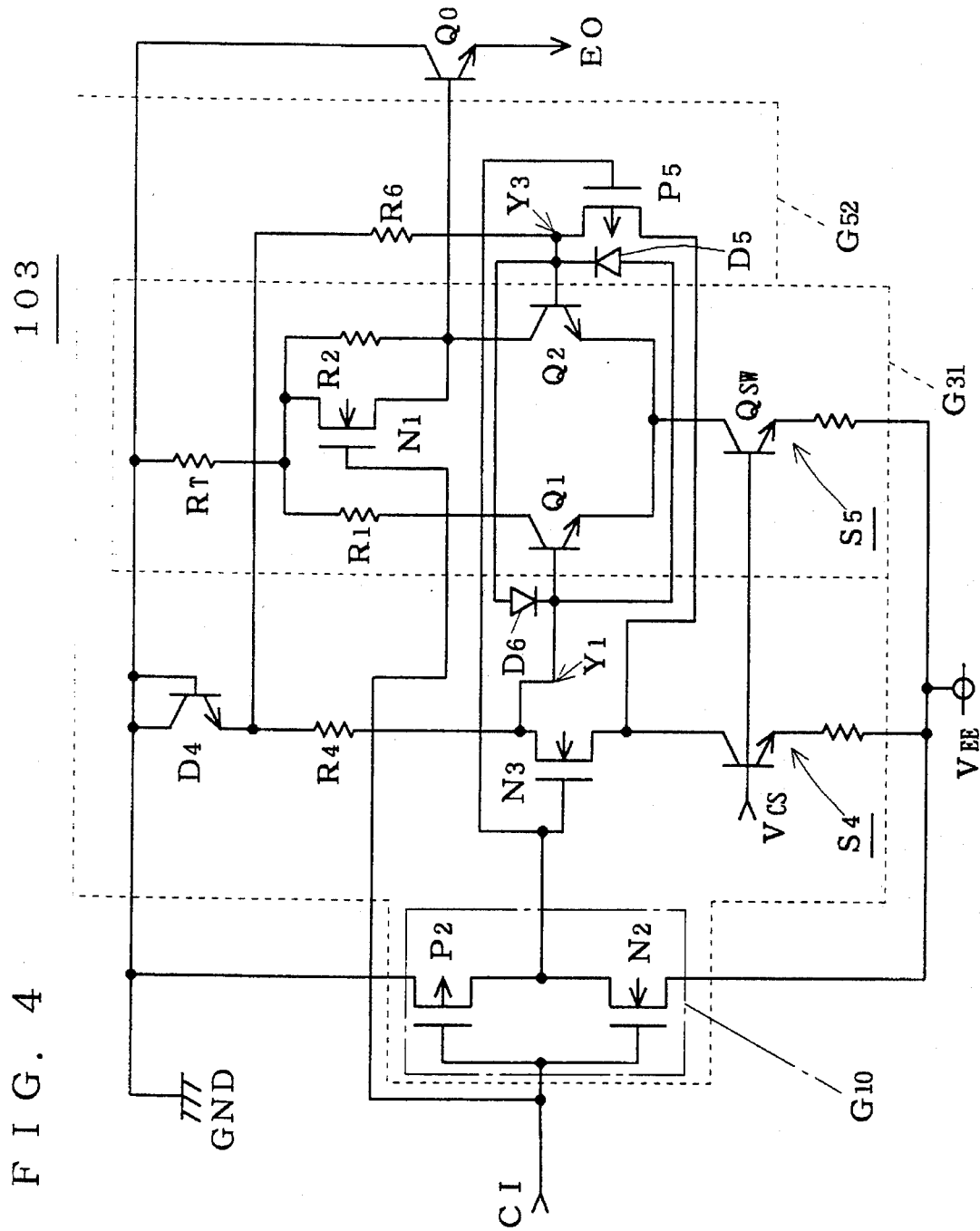
FIG. 4 is a circuit diagram of an output buffer circuit 103 according to a fourth preferred embodiment of the present invention.

FIG. 4 is a circuit diagram of an output buffer circuit 103 according to a fourth preferred embodiment of the present invention. The output buffer circuit 103 is constructed such that an intermediate signal generator circuit $G_{52}$ is substituted for the intermediate signal generator circuit $G_{51}$ of the output buffer circuit 102.

The intermediate signal generator circuit $G_{52}$ is constructed such that a PMOS transistor $P_5$ is substituted for the NMOS transistor $N_4$ Of the intermediate signal generator circuit $G_{51}$. The gate of the PMOS transistor $P_5$ receives the output from the inverter $G_{10}$ in place of the input signal CI.

Therefore, the PMOS transistor $P_5$ is similar in operation to the NMOS transistor $N_4$ Of the third preferred embodiment. However, the gate of the PMOS transistor $P_5$ is commonly connected to the gate of the NMOS transistor $N_3$. This eliminates the transition delay of the intermediate signals $Y_1$ and $Y_3$ resulting from the inverter $G_{10}$ which might possibly occur in the third preferred embodiment.

(b-5) Fifth Preferred Embodiment

Figure 5:
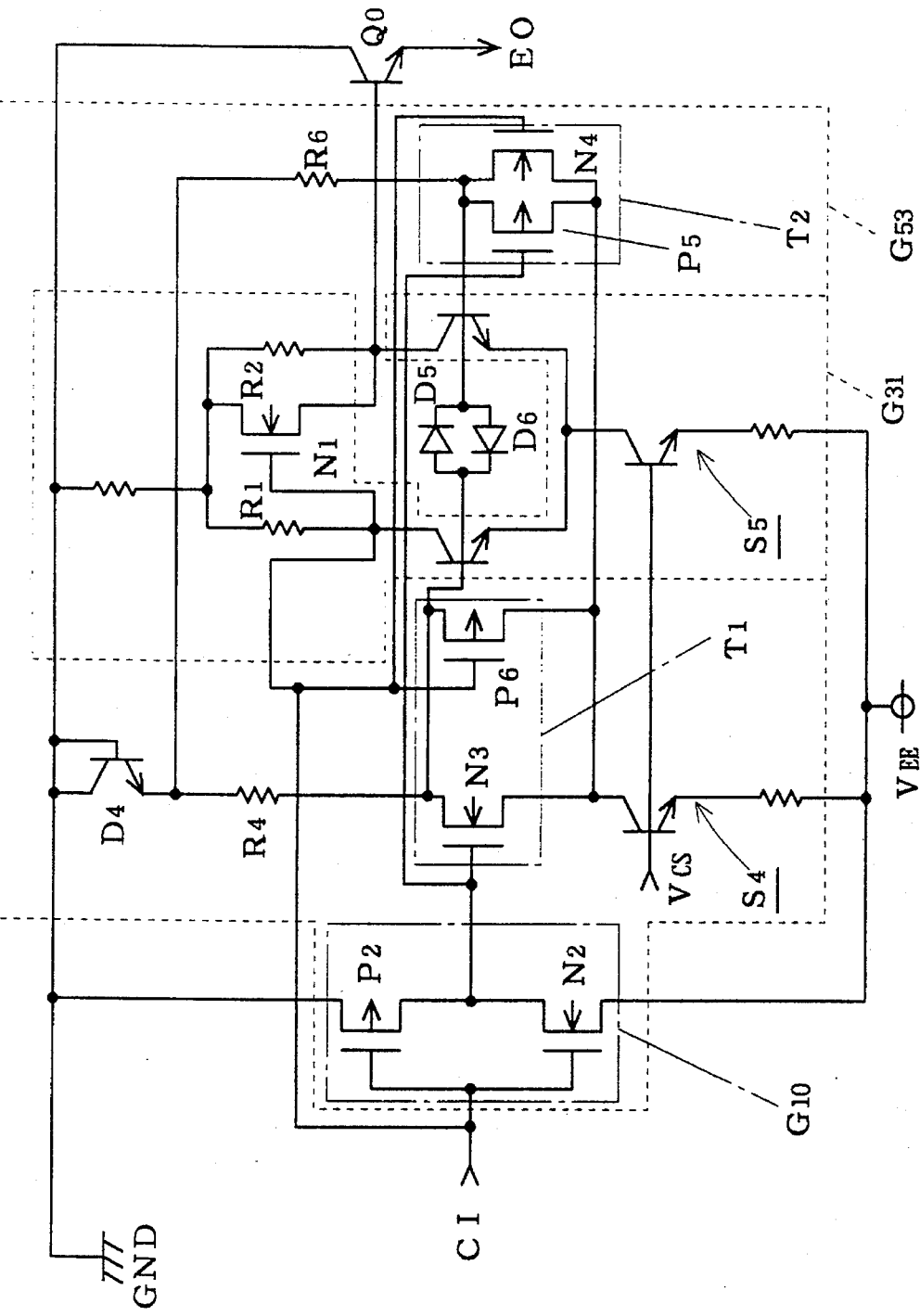
FIG. 5 is a circuit diagram of an output buffer circuit 104 according to a fifth preferred embodiment of the present invention.

FIG. 5 is a circuit diagram of an output buffer circuit 104 according to a fifth preferred embodiment of the present invention. The output buffer circuit 104 is constructed such that an intermediate signal generator circuit $G_{53}$ is substituted for the intermediate signal generator circuit $G_{51}$ of the output buffer circuit 102.

The intermediate signal generator circuit $G_{53}$ includes a PMOS transistor $P_6$ connected in parallel with the NMOS transistor $N_3$, and the PMOS transistor $P_5$ connected in parallel with the NMOS transistor $N_4$ in addition to the components of the intermediate signal generator circuit $G_{51}$. In other words, the intermediate signal generator circuit $G_{53}$ includes the PMOS transistor $P_6$ connected in parallel with the NMOS transistor $N_3$, and the NMOS transistor $N_4$ connected in parallel with the PMOS transistor $P_5$ in addition to the components of the intermediate signal generator circuit $G_{52}$ of the output buffer circuit 103. The input signal CI is applied to the gate of the PMOS transistor $P_6$.

The input signal CI is applied to the PMOS transistor $P_6$ and the NMOS transistor $N_4$, and the output from the inverter $G_{10}$ is applied to the gates of the NMOS transistor $N_3$ and the PMOS transistor $P_5$. The NMOS transistor $N_3$ and the PMOS transistor $P_6$ form a transfer gate $T_1$, and the PMOS transistor $P_5$ and the NMOS transistor $N_4$ form a transfer gate $T_2$.

The transfer gates $T_1$ and $T_2$ are used in production of the intermediate signals $Y_1$ and $Y_3$, providing the effect of suppressing the transition delay of the intermediate signals $Y_1$ and $Y_3$ as well as the effects similar to those of the third preferred embodiment.

(b-6) Sixth Preferred Embodiment

Figure 6:
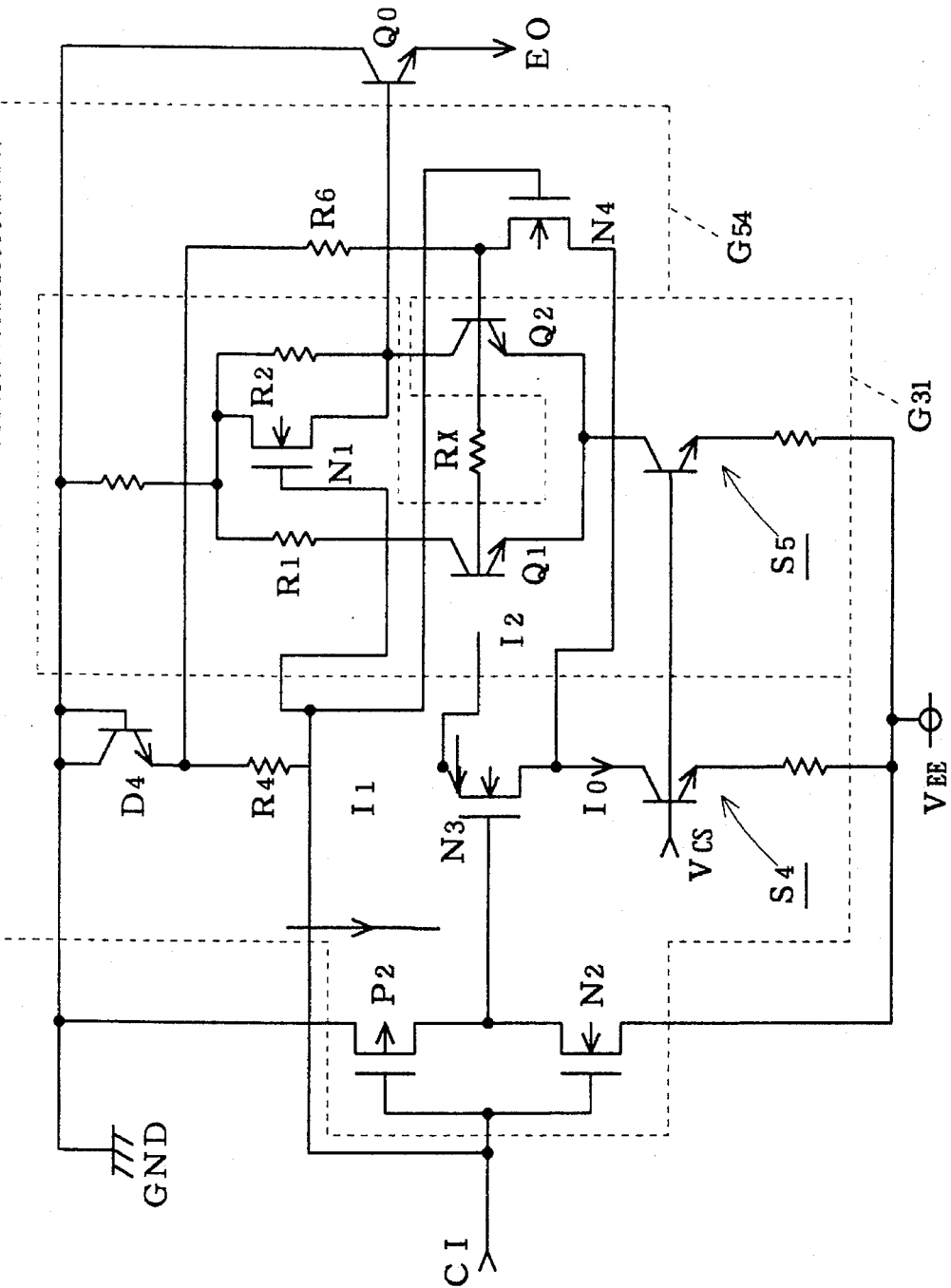
FIG. 6 is a circuit diagram of an output buffer circuit 105 according to a sixth preferred embodiment of the present invention.

FIG. 6 is a circuit diagram of an output buffer circuit 105 according to a sixth preferred embodiment of the present invention. The output buffer circuit 105 is constructed such that an intermediate signal generator circuit $G_{54}$ is substituted for the intermediate signal generator circuit $G_{51}$ of the output buffer circuit 102. The intermediate signal generator circuit $G_{54}$ is constructed such that a potential determining resistor $R_X$ is substituted for the inverse-parallel connected diodes $D_5$ and $D_6$ Of the intermediate signal generator circuit $G_{51}$.

In the output buffer circuit 102 of the third preferred embodiment, the voltage supported by the inverse-parallel connected diodes $D_5$ and $D_6$ is about 0.8 V, resulting in the absolute value of the difference between the intermediate signals $Y_1$ and $Y_3$ being fixed to about 0.8 V. In the sixth preferred embodiment, however, the resistance of the potential determining resistor $_X$ and the current flowing therethrough are determined to control the absolute value of the difference between the intermediate signals $Y_1$ and $Y_3$.

With continued reference to FIG. 6, current supplied from the current source $S_4$ is designated as $I_0$. Part of the current $I_0$ which flows through the resistor $R_4$ is designated as $I_1$, and the remaining part of the current $I_0$ which flows from the base of the transistor $Q_2$ to the base of the transistor $Q_1$ is designated as $I_2$. The base current of the transistors $Q_1$ and $Q_2$ is ignored.

The current $I_2$ is set to be less than the current $I_1$ to suppress power consumption.

$$I_1 = N \cdot I_2 \tag{11}$$

where N>1. A voltage drop $V_4$ in the resistor $R_4$ is $$V_4 = R_4 \cdot I_1 = (R_6 + R_X) \cdot I_2 \tag{12}$$

In order to make equal a voltage drop in the resistor $R_4$ when the NMOS transistor $N_3$ is on and a voltage drop in the resistor $R_6$ when the NMOS transistor $N_4$ is on, $$R_4 = R_6 \tag{13}$$

As above described, $$I_0 = I_1 + I_2 \tag{14}$$

Therefore, the resistance of the potential determining resistor $R_X$ is $$R_X = (N-1) \cdot R_4 \tag{15}$$

Figure 7:
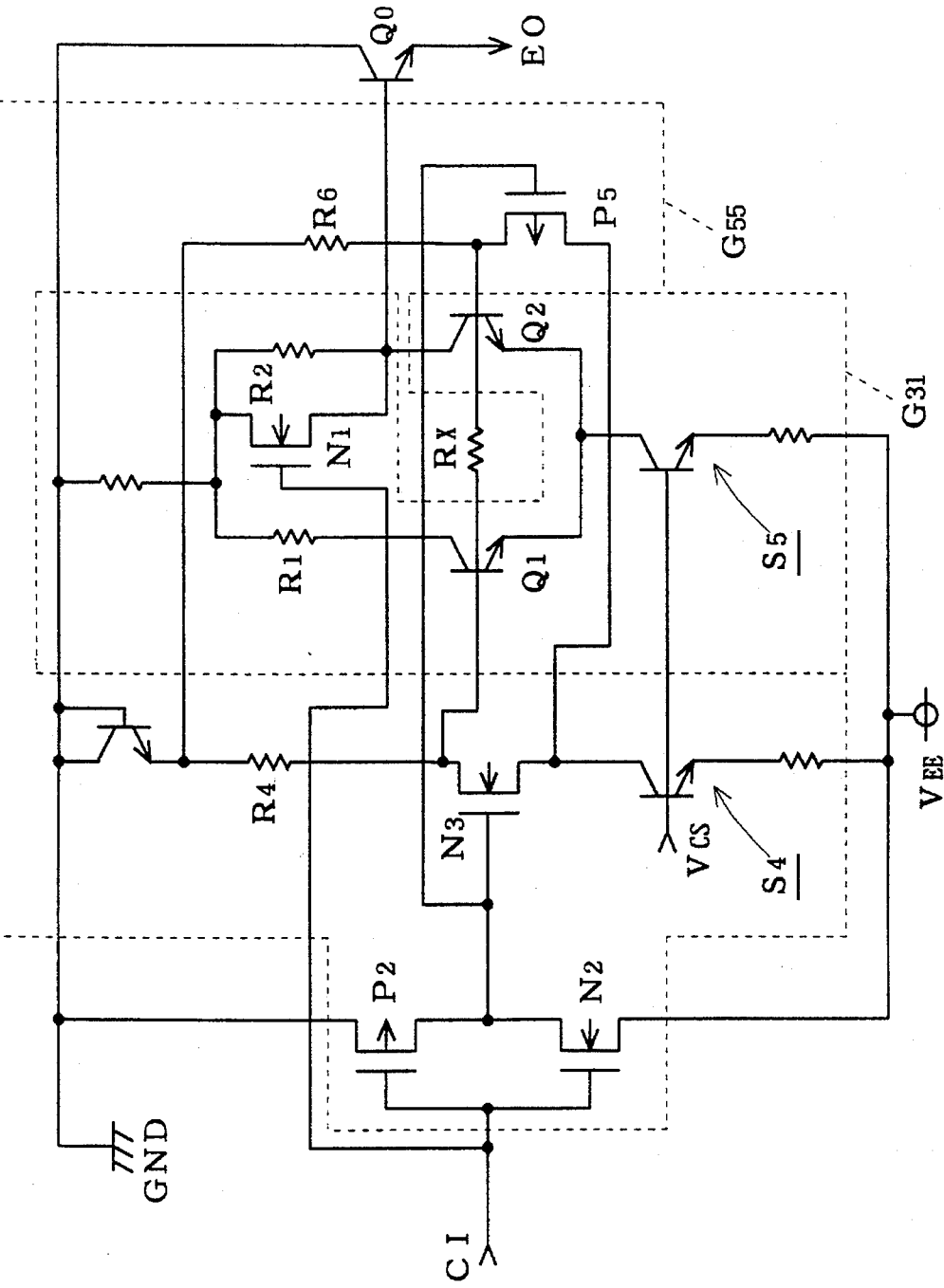
FIG. 7 is a circuit diagram of an output buffer circuit 106 according to a modification of the sixth preferred embodiment of the present invention.

FIG. 7 is a circuit diagram of an output buffer circuit 106 according to a modification of the sixth preferred embodiment. The output buffer circuit 106 is constructed such that the potential determining resistor $R_X$ is substituted for the inverse-parallel connected diodes $D_5$ and $D_6$ of the output buffer circuit 103. Thus, the output buffer circuit 106 is advantageous over the output buffer circuit 105 in suppression of the transition delay of the intermediate signals $Y_1$ and $Y_3$.

C. Second Feature

A Second feature of the present invention provides an output buffer circuit wherein a transistor for receiving an intermediate signal given in response to an input signal and a transistor for controlling an output transistor are the same, which will be described in detail in respective preferred embodiments.

(c-1) Seventh Preferred Embodiment

Figure 8:
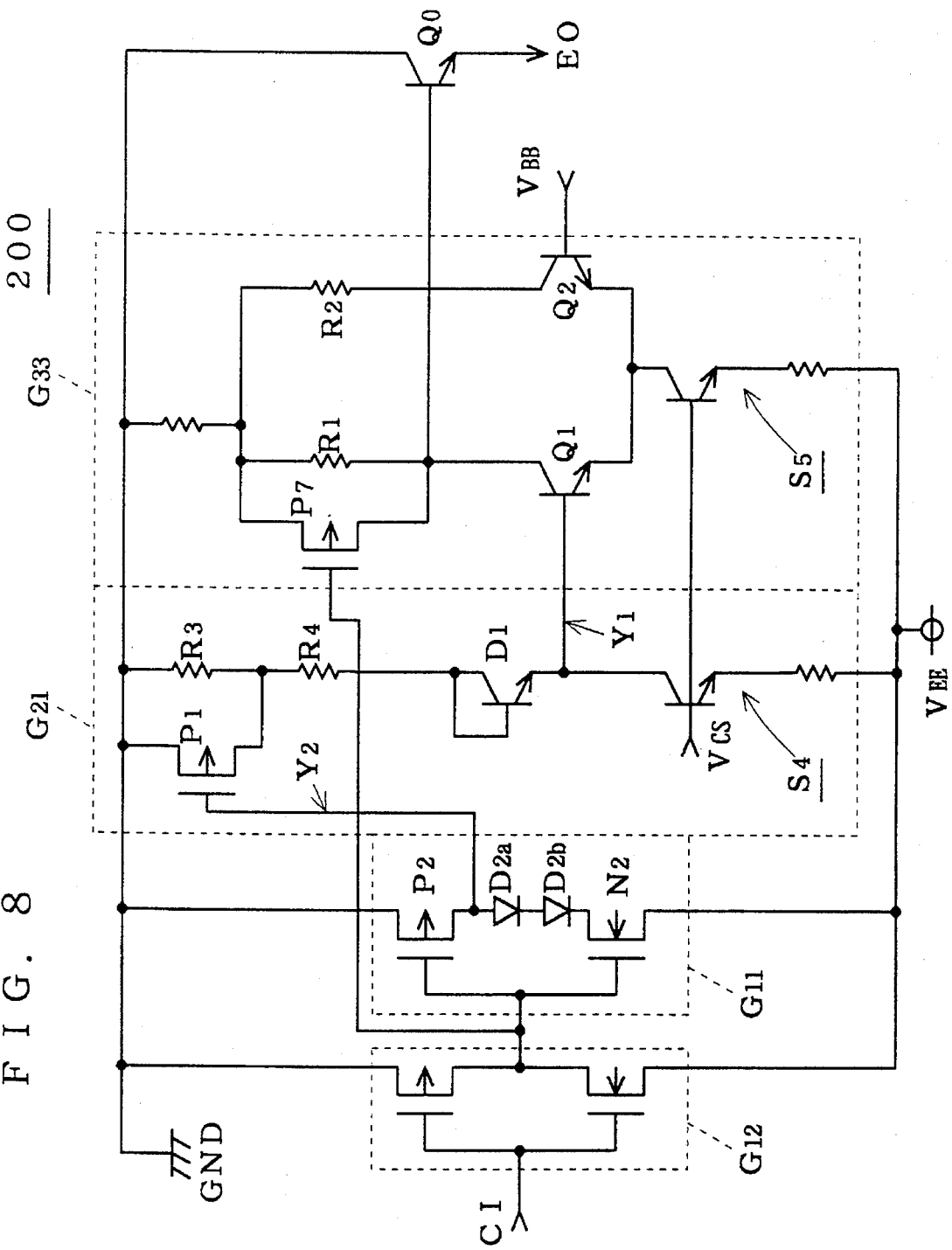
FIG. 8 is a circuit diagram of an output buffer circuit 200 according to a seventh preferred embodiment of the present invention.

FIG. 8 is a circuit diagram of an output buffer circuit 200 according to a seventh preferred embodiment of the present invention. The seventh preferred embodiment corresponds to the first preferred embodiment. The output buffer circuit 200 is constructed such that a CMOS inverter $G_{12}$ is added between the input terminal and the inverter $G_{11}$ of the output buffer circuit 100, and a current switch $G_{33}$ is substituted for the current switch $G_{31}$ of the output buffer circuit 100.

The CMOS inverter $G_{12}$ shapes the waveform of the input signal CI to suppress a subsequent malfunction of the circuit. However, the result is the logic applied to the inverter $G_{11}$ in inverse relation to the logic of the input signal CI. For this reason, the base of the output transistor $Q_0$ is connected to the collector of the transistor $Q_1$ receiving the intermediate signal $Y_1$ in the current switch $G_{33}$. It is hence desirable to vary the resistance between the collector of the transistor $Q_1$ and the power supply GND in the current switch $G_{33}$ in response to on/off of the transistor $Q_1$.

Thus, a PMOS transistor $P_7$ is connected in parallel with the resistor $R_1$ and has a gate receiving the output from the inverter $G_{12}$.

When the input signal CI makes the "L" to "H" transition, the logic of the intermediate signal $Y_1$ becomes "L". Then the transistor $Q_1$ turns off and the transistor $Q_2$ turns on. The output from the CMOS inverter $G_{12}$ at the potential corresponding to the logic "L" at the CMOS level has been applied to the gate of the PMOS transistor $P_7$. Thus, the PMOS transistor $P_7$ turns on.

Since the transistor $Q_1$ is off, only the base current of the output transistor $Q_0$ flows through the parallel connection of the resistor $R_1$ and the on-resistance of the PMOS transistor $P_7$. At this time, since the PMOS transistor $P_7$ is on, the base potential of the transistor $Q_0$ is raised if the resistor $R_1$ has an increased resistance, and the current fed by the output transistor $Q_0$ increases. The emitter potential of the output transistor $Q_0$ is also raised. Then the logic of the output signal EO becomes "H" as well as the logic of the input signal CI.

Conversely, when the input signal CI makes the "H" to "L" transition, the logic of the intermediate signal $Y_1$ becomes "H". Then the transistor $Q_1$ turns on and the transistor $Q_2$ turns off. The potential corresponding to the logic "H" at the CMOS level has been applied to the gate of the PMOS transistor $P_7$. Thus, the PMOS transistor $P_7$ turns off. Since the transistor $Q_2$ is off, the constant current from the current source $S_5$ as well as the base current of the output transistor $Q_0$ flows through the resistor $R_1$. Since the logic of the output signal EO is permitted to go high if the resistor $R_1$ has the increased resistance as above described, the resistance of the resistor $R_1$ is set to a high value. This permits the collector potential of the transistor $Q_1$ to be low if the constant current from the current source $S_5$ is small. Thus, the emitter potential of the output transistor is lowered, and the logic of the output signal EO becomes "L".

As above stated, the seventh preferred embodiment provides effects similar to those of the first preferred embodiment by changing the transistor connected to the base of the output transistor without logic inversion if the inverter $G_{12}$ is provided for waveform shaping.

(c-2) Eighth Preferred Embodiment

Figure 9:
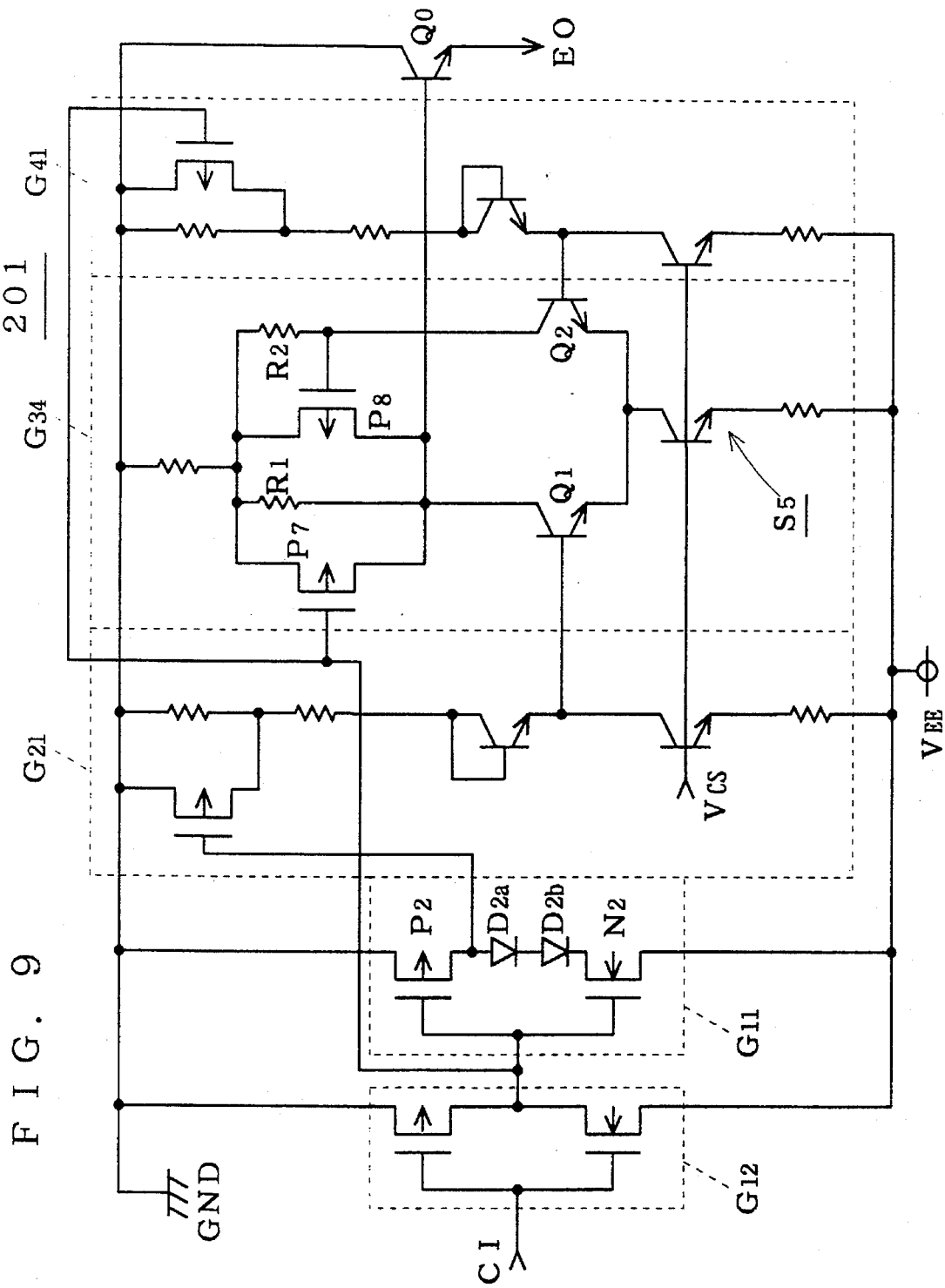
FIG. 9 is a circuit diagram of an output buffer circuit 201 according to an eighth preferred embodiment of the present invention.

FIG. 9 is a circuit diagram of an output buffer circuit 201 according to an eighth preferred embodiment of the present invention. The eighth preferred embodiment corresponds to the second preferred embodiment. The output buffer circuit 201 is constructed such that a current switch $G_{34}$ is substituted for the current switch $G_{33}$ of the output buffer circuit 200.

The current switch $G_{34}$ is constructed such that a PMOS transistor $P_8$ is added to the components of the current switch $G_{33}$. The PMOS transistor $P_8$ has source and drain connected to the resistor $R_1$, and a gate connected to the collector of the transistor $Q_2$.

When the input signal makes the "L" to "H" transition, the transistor $Q_1$ turns off and the transistor $Q_2$ turns on. At this time, the potential corresponding to the logic "L" at the CMOS level has been applied to the gate of the PMOS transistor $P_7$, and the PMOS transistor $P_7$ turns on. Since the transistor $Q_2$ is on, the collector potential of the transistor $Q_2$ drops, and the PMOS transistor $P_8$ turns on.

The collector potential of the transistor $Q_1$ of the eighth preferred embodiment rises more easily than that of the seventh preferred embodiment. Thus, the effects similar to those of the second preferred embodiment are provided. It should be noted that the two MOS transistors $P_7$ and $P_8$ are of the same conductivity type in the eighth preferred embodiment, unlike the second preferred embodiment.

(c-3) Ninth Preferred Embodiment

Figure 10:
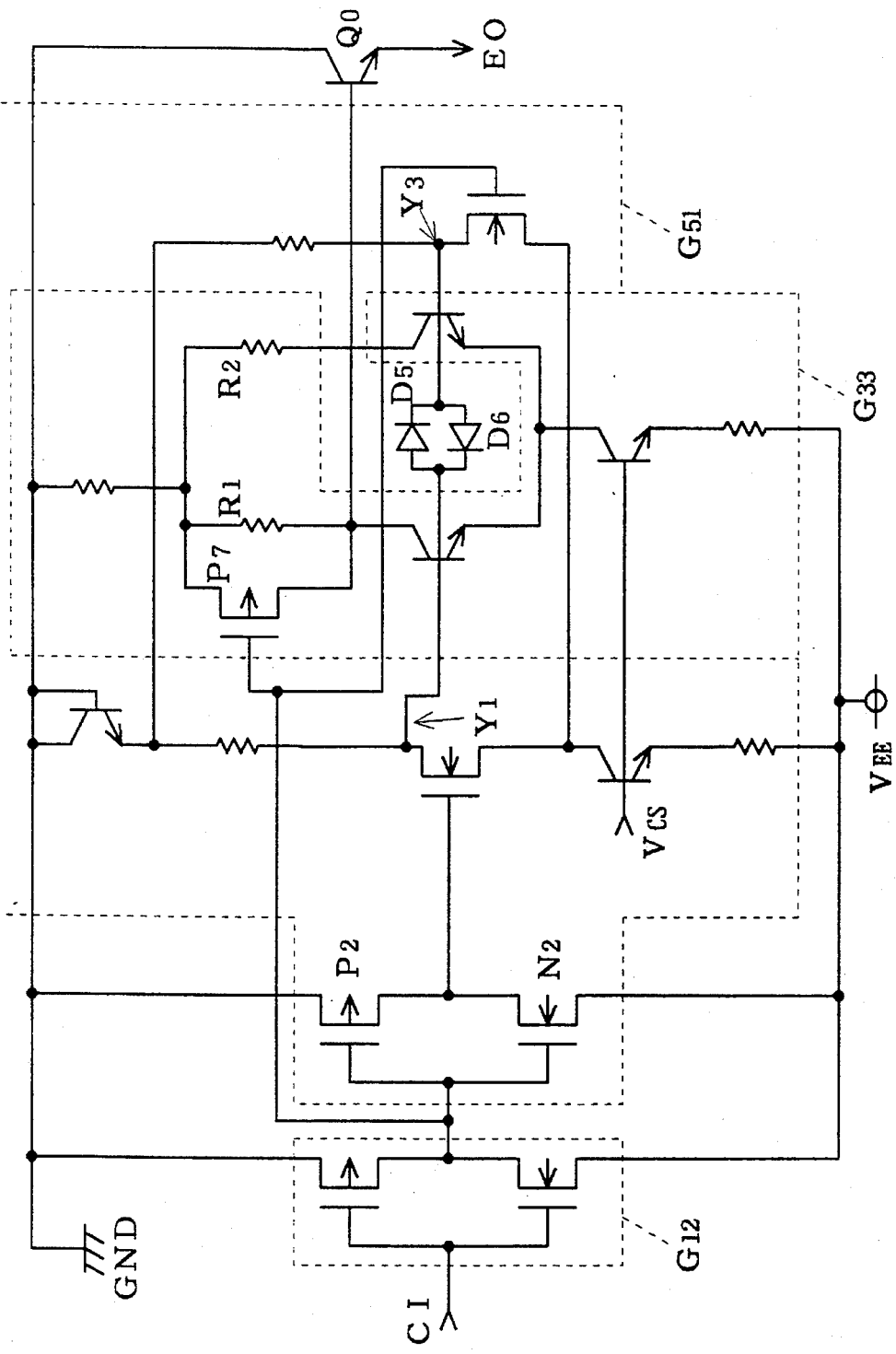
FIG. 10 is a circuit diagram of an output buffer circuit 202 according to a ninth preferred embodiment of the present invention.

FIG. 10 is a circuit diagram of an output buffer circuit 202 according to a ninth preferred embodiment of the present invention. The ninth preferred embodiment corresponds to the third preferred embodiment. Similar to the output buffer circuit 200, the output buffer circuit 202 comprises the current switch $G_{33}$. The output buffer circuit 202 further comprises an intermediate signal generator circuit $G_{51}$ for applying the two intermediate signals $Y_1$ and $Y_3$ to the current switch $G_{33}$.

The operation of the current switch $G_{33}$ is described in the seventh preferred embodiment, and the operation of the intermediate signal generator circuit $G_{51}$ is described in the third preferred embodiment. The ninth preferred embodiment accordingly provides effects similar to those of the third preferred embodiment.

(c-4) Tenth Preferred Embodiment

Figure 11:
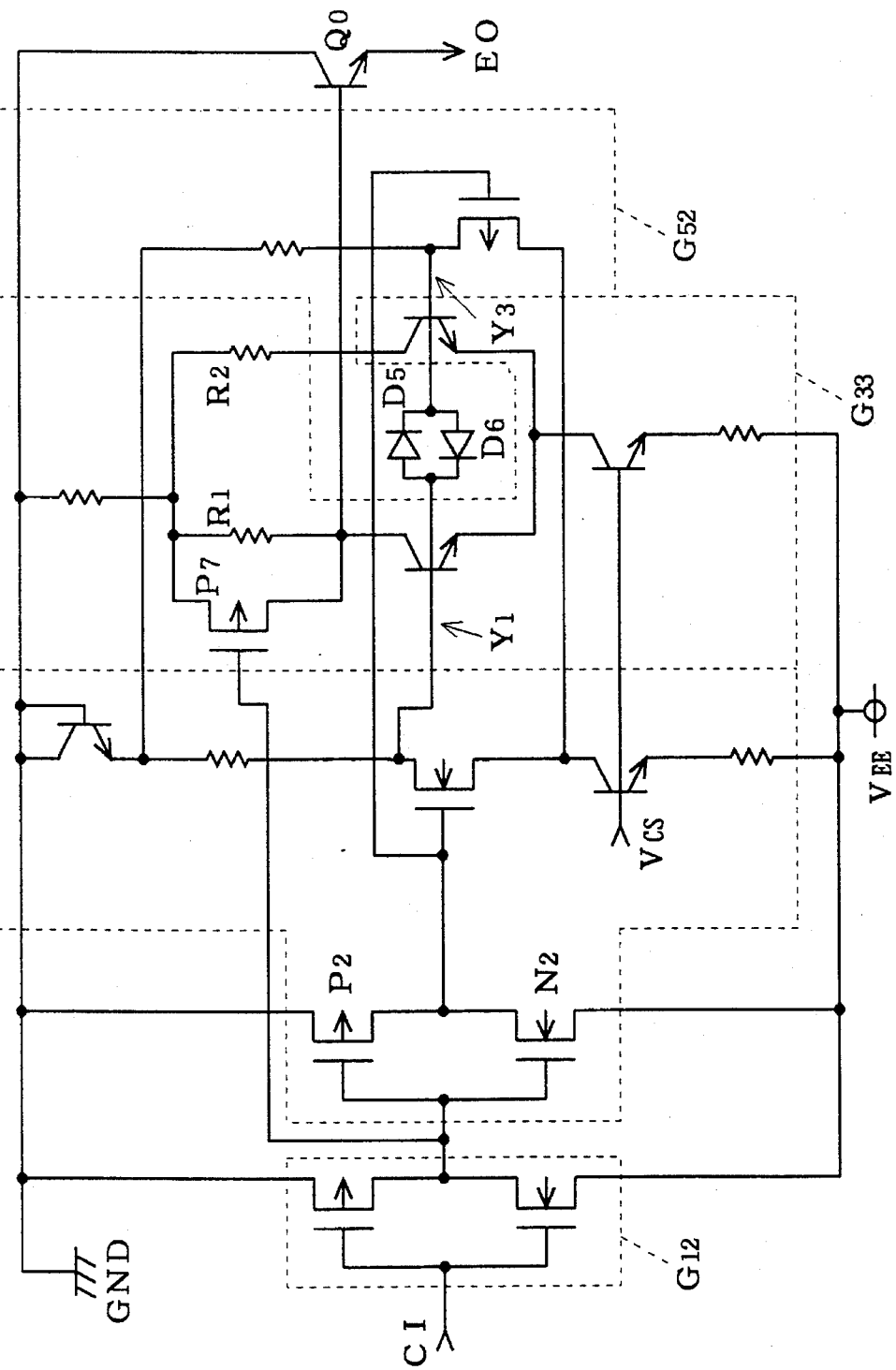
FIG. 11 is a circuit diagram of an output buffer circuit 203 according to a tenth preferred embodiment of the present invention.

FIG. 11 is a circuit diagram of an output buffer circuit 203 according to a tenth preferred embodiment of the present invention. The tenth preferred embodiment corresponds to the fourth preferred embodiment. Relation between the tenth preferred embodiment and the ninth preferred embodiment is similar to relation between the fourth preferred embodiment and the third preferred embodiment.

That is, replacement of the intermediate signal generator circuit $G_{51}$ with the intermediate signal generator circuit $G_{52}$ allows transition delay of the intermediate signals $Y_1$ and $Y_3$ to be suppressed, similar to the fourth preferred embodiment.

(c-5) Eleventh Preferred Embodiment

Figure 12:
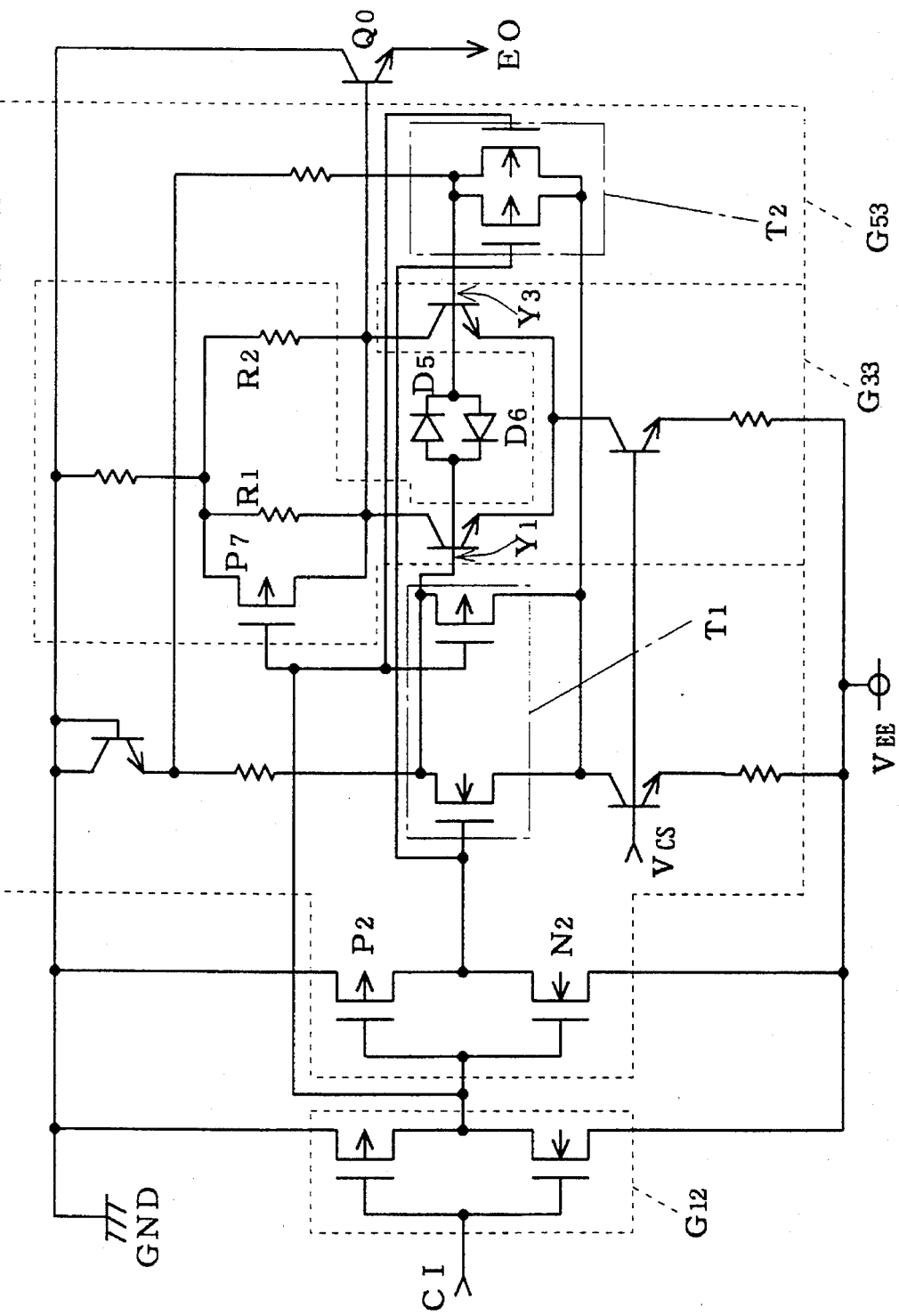
FIG. 12 is a circuit diagram of an output buffer circuit 204 according to an eleventh preferred embodiment of the present invention.

FIG. 12 is a circuit diagram of an output buffer circuit 204 according to an eleventh preferred embodiment of the present invention. The eleventh preferred embodiment corresponds to the fifth preferred embodiment. The output buffer circuit 204 is constructed such that the intermediate signal generator circuit $G_{53}$ is substituted for the intermediate signal generator circuit $G_{51}$ of the output buffer circuit 202.

The intermediate signals $Y_1$ and $Y_3$ are produced by using the transfer gates $T_1$ and $T_2$, thereby suppressing transition delay of the intermediate signals $Y_1$ and $Y_3$.

(c-6) Twelfth Preferred Embodiment

Figure 13:
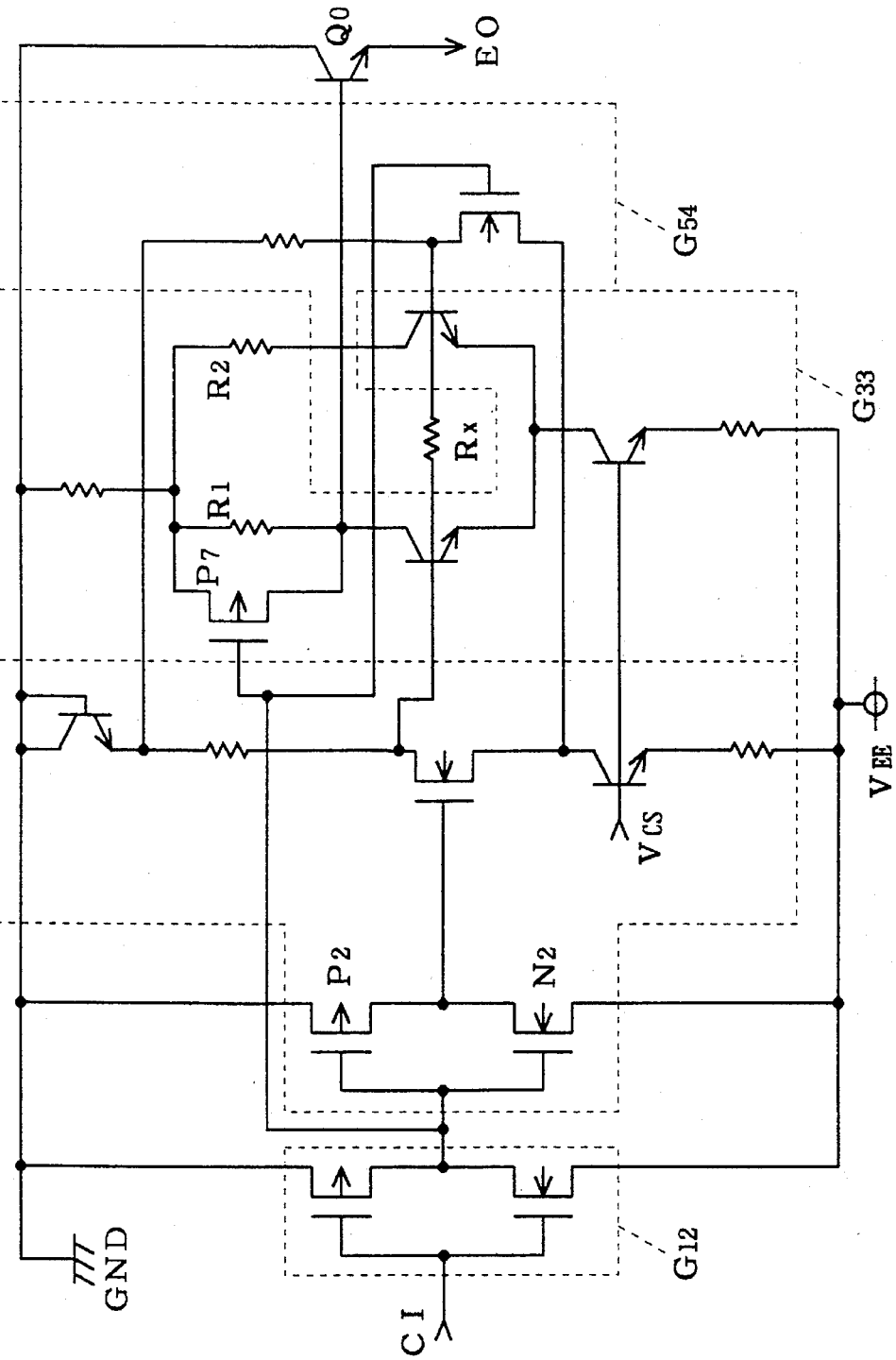
FIG. 13 is a circuit diagram of an output buffer circuit 205 according to a twelfth preferred embodiment of the present invention.

FIG. 13 is a circuit diagram of an output buffer circuit 205 according to a twelfth preferred embodiment of the present invention. The twelfth preferred embodiment corresponds to the sixth preferred embodiment, and the output buffer circuit 205 corresponds to the output buffer circuit 105 of the sixth preferred embodiment. That is, the output buffer circuit 205 is constructed such that the potential determining resistor $R_X$ is substituted for the inverse-parallel connected diodes $D_5$ and $D_6$ of the output buffer circuit 202.

Figure 14:
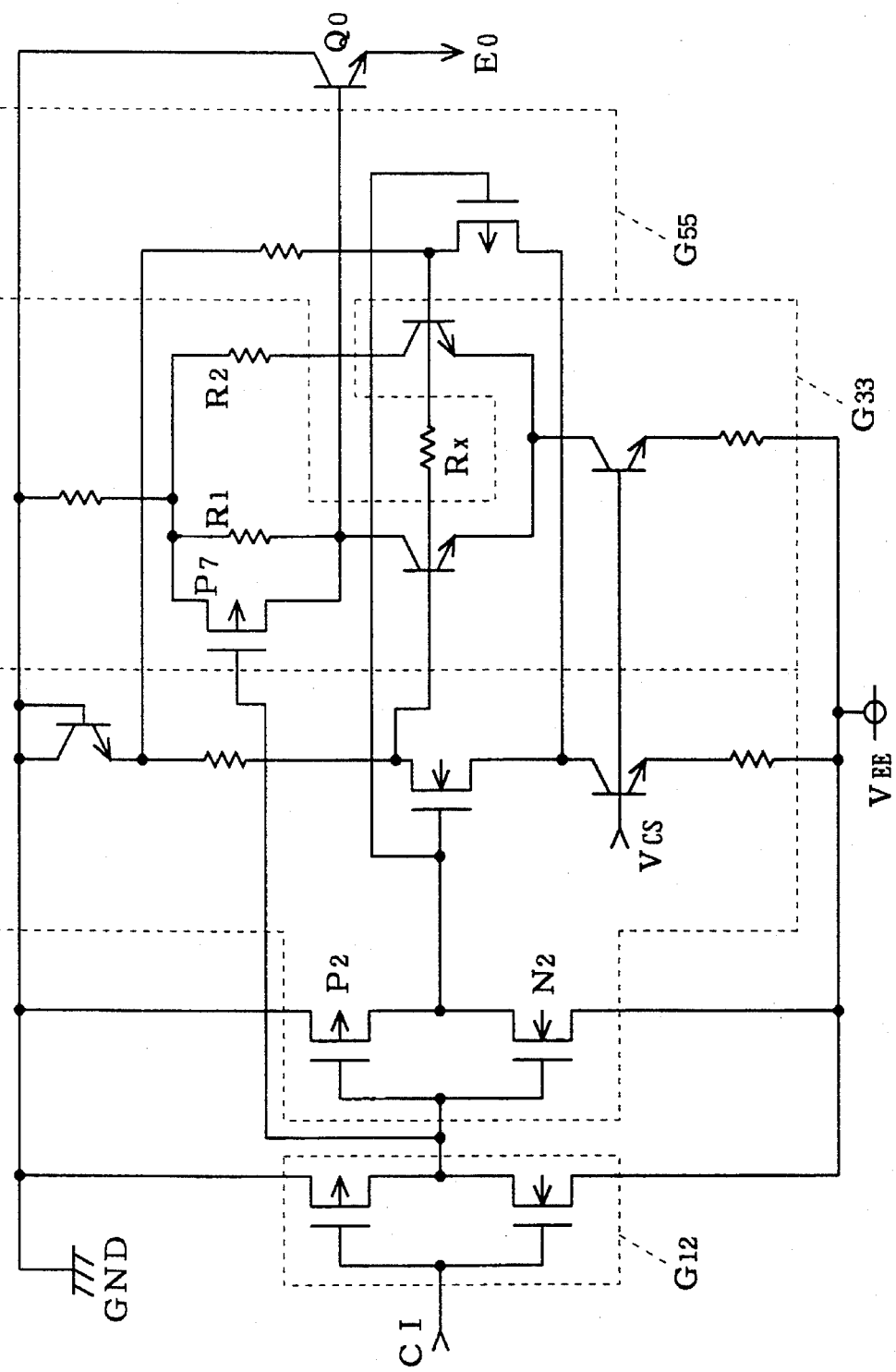
FIG. 14 is a circuit diagram of an output buffer circuit 206 according to a modification of the twelfth preferred embodiment of the present invention.

FIG. 14 is a circuit diagram of an output buffer circuit 206 according to a modification of the twelfth preferred embodiment of the present invention. The output buffer circuit 206 is constructed such that the potential determining resistor $R_X$ is substituted for the inverse-parallel connected diodes $D_5$ and $D_6$ of the output buffer circuit 203.

Thus, the twelfth preferred embodiment provides effects similar to those of the sixth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. An output buffer circuit comprising:
   (a) an input terminal receiving an input signal having a potential corresponding to one of binary logics "H" and "L" at a CMOS level;
   (b) a first level shifter for producing a first intermediate signal having a potential at an ECL level corresponding to a logic identical with the logic of said input signal;
   (c) a current switch including
      (c-1) a first voltage source for providing a constant potential,
      (c-2) a first current source for providing a constant current,
      (c-3) first and second resistors,
      (c-4) a first bipolar transistor having a collector connected to said first voltage source through said first resistor, an emitter connected to said first current source, and a base receiving said first intermediate signal,
      (c-5) a second bipolar transistor having a collector connected to said first voltage source through said second resistor, an emitter connected to said first current source, and a base receiving a reference potential, and
      (c-6) a first NMOS transistor having source and drain connected to opposite ends of said second resistor, and a gate receiving said input signal; and
   (d) an output bipolar transistor having a base connected to said collector of said second bipolar transistor, a collector connected to said first voltage source, and an emitter.

2. The output buffer circuit of claim 1,
   wherein said first level shifter includes:
   (b-1) an inverter receiving said input signal for producing a second intermediate signal having a logic complementary to the logic of said input signal;
   (b-2) a first PMOS transistor having a gate receiving said second intermediate signal, a source, and a drain;
   (b-3) a third resistor connected between said drain and source of said first PMOS transistor in parallel therewith;
   (b-4) a fourth resistor;
   (b-5) a first diode having a cathode, and an anode closer to said first voltage source than said cathode; and
   (b-6) a second current source connected to said base of said first bipolar transistor for feeding a constant, current, and
   wherein parallel connection of said first PMOS transistor and said third resistor, said fourth resistor, and said first diode are connected in series between said first voltage source and said second current source.

3. The output buffer circuit of claim 2,
   wherein said inverter includes:
   (b-1-1) a second voltage source for providing a potential lower than the potential of said first voltage source;
   (b-1-2) a second PMOS transistor having a source connected to said first voltage source, a gate connected to said input terminal, and a drain;
   (b-1-3) a second NMOS transistor having a source connected to said second voltage source, a gate connected to said input terminal, and a drain; and
   (b-1-4) a second diode having an anode connected to said drain of said second PMOS transistor, and a cathode connected to said drain of said second NMOS transistor, and
   wherein said second intermediate signal is outputted from said anode of said second diode.

4. The output buffer circuit of claim 3,
   wherein said current switch further includes:
   (c-7) a third PMOS transistor having source and drain connected to the opposite ends of said second resistor, and a gate connected to said collector of said first bipolar transistor.

5. The output buffer circuit of claim 4, further comprising
   (e) a second level shifter including:
   (e-1) a fourth PMOS transistor having a gate receiving said input signal, a source connected to said first voltage source, and a drain;
   (e-2) a fifth resistor connected between said drain and source of said fourth PMOS transistor in parallel therewith;
   (e-3) a sixth resistor having a first end, and a second end connected to said drain of said fourth PMOS transistor;
   (e-4) a third diode having a cathode applying said reference potential to said current switch, and an anode connected to said first end of said sixth resistor; and
   (e-5) a third current source connected to said cathode of said third diode for feeding a constant current.

6. An output buffer circuit comprising:
   (a) an input terminal receiving an input signal having a potential corresponding to one of binary logics "H" and "L" at a CMOS level;
   (b) a current switch including
      (b-1) a first voltage source for providing a constant potential,
      (b-2) a first current source for providing a constant current,
      (b-3) first and second resistors,
      (b-4) a first bipolar transistor having a collector connected to said first voltage source through said first resistor, an emitter connected to said first current source, and a base receiving a first intermediate signal,
      (b-5) a second bipolar transistor having a collector connected to said first voltage source through said second resistor, an emitter connected to said first current source, and a base receiving a second intermediate signal, and
      (b-6) a first NMOS transistor having source and drain connected to opposite ends of said second resistor, and a gate receiving said input signal;
   (c) an intermediate signal generator circuit receiving said input signal for producing said first and second intermediate signals, said first intermediate signal being higher in potential than said second intermediate signal when the logic of said input signal is "H", said first intermediate signal being lower in potential than said second intermediate signal when the logic of said input signal is "L"; and
   (d) an output bipolar transistor having a base connected to said collector of said second bipolar transistor, a collector connected to said first voltage source, and an emitter.

7. The output buffer circuit of claim 6,
   wherein said intermediate signal generator circuit includes:
   (c-1) a first switch having first and second ends, said first and second ends of said first switch being non-connected when the logic of said input signal is "H", said first and second ends of said first switch being connected when the logic of said input signal is "L" said second end being applied to a constant current;

(c-2) a third resistor connected between said first end of said first switch and said first voltage source;

(c-3) a second switch having first and second ends, said first and second ends of said first switch being non-connected when the logic of said input signal is "H", said first and second ends of said first switch being connected when the logic of said input signal is "L", said second end being applied to said constant current;

(c-4) a fourth resistor connected between said first end of said second switch and said first voltage source;

(c-5) a first diode having a cathode connected to said first end of said first switch, and an anode connected to said first end of said second switch; and (c-6) a second diode having an anode connected to said first end of said first switch, and a cathode connected to said first end of said second switch, and wherein said first intermediate signal is outputted from said cathode of said first diode, and said second intermediate signal is outputted from said cathode of said second diode.

8. The output buffer circuit of claim 7, wherein predetermined voltage with minus temperature coefficient is held both between said first end of said third resistor and said first voltage source and between said first end of said fourth resistor and said first voltage source.

9. The output buffer circuit of claim 8, wherein said intermediate signal generator circuit further includes:

(c-7) a diode holding said predetermined voltage.

10. The output buffer circuit of claim 8, wherein said intermediate signal generator circuit further includes:

(c-7) a second current source flowing said predetermined constant current.

11. The output buffer circuit of claim 7, wherein said first switch includes (c-1-1) a second NMOS transistor having a gate receiving a control signal having a logic complementary to the logic of said input signal, and drain and source connected to said first and second ends of said first switch, respectively, and wherein said second switch includes (c-3-1) a PMOS transistor having a gate receiving said control signal, and drain and source connected to said first and second ends of said second switch, respectively.

12. The output buffer circuit of claim 7, wherein said first switch includes (c-1-2) a second NMOS transistor having a gate receiving a control signal having a logic complementary to the logic of said input signal, and drain and source connected to said first and second ends of said first switch, respectively, wherein said second switch includes (c-3-2) a third NMOS transistor having a gate receiving said control signal, and drain and source connected to said first and second ends of said second switch, respectively, and wherein said intermediate signal generator circuit further includes (c-8) an inverter receiving said input signal for producing said control signal.

13. The output buffer circuit of claim 12, wherein said intermediate signal generator circuit further includes:

(c-9) a first PMOS transistor having a drain connected to said drain of said second NMOS transistor, a source connected to said source of said second NMOS transistor, and a gate receiving said input signal; and (c-10) a second PMOS transistor having a drain connected to said drain of said third NMOS transistor, a source connected to said source of said third NMOS transistor, and a gate receiving said control signal.

14. The output buffer circuit of claim 6, wherein said intermediate signal generator circuit includes:

(c-1) a first switch having first and second ends, said first and second ends of said first switch being non-connected when the logic of said input signal is "H", said first and second ends of said first switch being connected when the logic of said input signal is "L", said second end being applied to a constant current;

(c-2) a third resistor connected between said first end of said first switch and said first voltage source;

(c-3) a second switch having first and second ends, said first and second ends of said first switch being non-connected when the logic of said input signal is "H", said first and second ends of said first switch being connected when the logic of said input signal is "L", said second end being applied to said constant current;

(c-4) a fourth resistor connected between said first end of said second switch and said first voltage source;

(c-5) a potential determining resistor between said first end of said first switch and said first end of said second switch.

15. An output buffer circuit comprising:

(a) an input terminal receiving an input signal having a potential corresponding to one of binary logics "H" and "L" at a CMOS level;

(b) a CMOS inverter for inverting the logic applied to said input terminal;

(c) a first level shifter for producing a first intermediate signal having a potential at an ECL level corresponding to a logic identical with the logic of an output from said CMOS inverter;

(d) a current switch including (d-1) a first voltage source for providing a constant potential, (d-2) a first current source for providing a constant current, (d-3) first and second resistors, (d-4) a first bipolar transistor having a collector connected to said first voltage source through said first resistor, an emitter connected to said first current source, and a base receiving said first intermediate signal, (d-5) a second bipolar transistor having a collector connected to said first voltage source through said second resistor, an emitter connected to said first current source, and a base receiving a reference potential, and (d-6) a first PMOS transistor having source and drain connected to opposite ends of said first resistor, and a gate receiving the output from said CMOS inverter; and (e) an output bipolar transistor having a base connected to said collector of said first bipolar transistor, a collector connected to said first voltage source, and an emitter.

16. The output buffer circuit of claim 1, wherein said first level shifter includes:
- (c-1) an inverter receiving the output from said CMOS inverter for producing a second intermediate signal complementary to the output from said CMOS inverter;
- (c-2) a second PMOS transistor having a gate receiving said second intermediate signal, a source, and a drain;
- (c-3) a third resistor connected between said drain and source of said second PMOS transistor in parallel therewith;
- (c-4) a fourth resistor;
- (c-5) a first diode having a cathode, and an anode closer to said first voltage source than said cathode; and
- (c-6) a second current source connected to said base of said first bipolar transistor for feeding a constant current, and wherein parallel connection of said first PMOS transistor and said third resistor, said fourth resistor, and said first diode are connected in series between said first voltage source and said second current source.

17. The output buffer circuit of claim 16, wherein said inverter includes:
- (c-1-1) a second voltage source for providing a potential lower than the potential of said first voltage source;
- (c-1-2) a third PMOS transistor having a source connected to said first voltage source, a gate connected to said input terminal, and a drain;
- (c-1-3) a first NMOS transistor having a source connected to said second voltage source, a gate connected to said input terminal, and a drain; and
- (c-1-4) a second diode having an anode connected to said drain of said third PMOS transistor, and a cathode connected to said drain of said first NMOS transistor, and wherein said second intermediate signal is outputted from said anode of said second diode.

18. The output buffer circuit of claim 17, wherein said current switch further includes:
- (d-7) a fourth PMOS transistor having source and drain connected to the opposite ends of said first resistor, and a gate connected to said collector of said second bipolar transistor.

19. The output buffer circuit of claim 18, further comprising (f) a second level shifter including:
- (f-1) a fifth PMOS transistor having a gate receiving the output from said CMOS inverter, a source connected to said first voltage source, and a drain;
- (f-2) a fifth resistor connected between said drain and source of said fifth PMOS transistor in parallel therewith;
- (f-3) a sixth resistor having a first end, and a second end connected to said drain of said fifth PMOS transistor;
- (f-4) a third diode having a cathode applying said reference potential to said current switch, and an anode connected to said first end of said sixth resistor; and
- (f-5) a third current source connected to said cathode of said third diode for feeding a constant current.

20. An output buffer circuit comprising:

(a) an input terminal receiving an input signal having a potential corresponding to one of binary logics "H" and "L" at a CMOS level;

(b) a CMOS inverter for inverting the logic applied to said input terminal;

(c) a current switch including
- (c-1) a first voltage source for providing a constant potential,
- (c-2) a first current source for providing a constant current,
- (c-3) first and second resistors,
- (c-4) a first bipolar transistor having a collector connected to said first voltage source through said first resistor, an emitter connected to said first current source, and a base receiving a first intermediate signal,
- (c-5) a second bipolar transistor having a collector connected to said first voltage source through said second resistor, an emitter connected to said first current source, and a base receiving a second intermediate signal, and
- (c-6) a first PMOS transistor having source and drain connected to opposite ends of said first resistor, and a gate receiving an output from said CMOS inverter;

(d) an intermediate signal generator circuit receiving the output from said CMOS inverter for producing said first and second intermediate signals, said first intermediate signal being higher in potential than said second intermediate signal when the logic of the output from said CMOS inverter is "H", said first intermediate signal being lower in potential than said second intermediate signal when the logic of the output from said CMOS inverter is "L"; and (e) an output bipolar transistor having a base connected to said collector of said first bipolar transistor, a collector connected to said first voltage source, and an emitter.

21. The output buffer circuit of claim 20, wherein said intermediate signal generator circuit includes:
- (d-1) a first switch having first and second ends, said first and second ends of said first switch being non-connected when the logic of the output from said CMOS inverter is "H", said first and second ends of said first switch being connected when the logic of said CMOS inverter is "L", said second end being applied to a constant current;
- (d-2) a third resistor connected between said first end of said first switch and said first voltage source;
- (d-3) a second switch having first and second ends, said first and second ends of said first switch being non-connected when the logic of said CMOS inverter is "H", said first and second ends of said first switch being connected when the logic of said CMOS inverter is "L", said second end being applied to said constant current;
- (d-4) a fourth resistor connected between said first end of said second switch and said first voltage source;
- (d-5) a first diode having a cathode connected to said first end of said first switch, and an anode connected to said first end of said second switch; and
- (d-6) a second diode having an anode connected to said first end of said first switch, and a cathode connected to said first end of said second switch, and wherein said first intermediate signal is outputted from said cathode of said first diode, and said second intermediate signal is outputted from said cathode of said second diode.

22. The output buffer circuit of claim 21, wherein predetermined voltage with minus temperature coefficient is held both between said first end of said third resistor and said first voltage source and between said first end of said fourth resistor and said first voltage source.

23. The output buffer circuit of claim 22, wherein said intermediate signal generator circuit further includes:
- (d-7) a diode holding said predetermined voltage.

24. The output buffer circuit of claim 23, wherein said intermediate signal generator circuit further includes:
- (d-7) a second current source flowing said predetermined constant current.

25. The output buffer circuit of claim 21, wherein said first switch includes
- (d-1-1) an NMOS transistor having a gate receiving a control signal having a logic complementary to the logic of the output from said CMOS inverter, and drain and source connected to said first and second ends of said first switch, respectively, and wherein said second switch includes
- (d-4-1) a second PMOS transistor having a gate receiving said control signal, and drain and source connected to said first and second ends of said second switch, respectively.

26. The output buffer circuit of claim 21, wherein said first switch includes
- (d-1-2) a first NMOS transistor having a gate receiving a control signal having a logic complementary to the logic of said input signal, and drain and source connected to said first and second ends of said first switch, respectively, wherein said second switch includes
- (d-3-2) a second NMOS transistor having a gate receiving said control signal, and drain and source connected to said first and second ends of said second switch, respectively, and wherein said intermediate signal generator circuit further includes
- (d-8) an inverter receiving said input signal for producing said control signal.

27. The output buffer circuit of claim 26, wherein said intermediate signal generator circuit further includes:
- (d-9) a second PMOS transistor having a drain connected to said drain of said first NMOS transistor, a source connected to said source of said first NMOS transistor, and a gate receiving the output from said CMOS inverter; and
- (d-10) a third PMOS transistor having a drain connected to said drain of said second NMOS transistor, a source connected to said source of said second NMOS transistor, and a gate receiving said control signal.

28. The output buffer circuit of claim 20, wherein said intermediate signal generator circuit includes:
- (d-1) a first switch having first and second ends, said first and second ends of said first switch being non-connected when the logic of said input signal is "H", said first and second ends of said first switch being connected when the logic of said input signal is "L", said second end being applied to a constant current;
- (d-2) a third resistor connected between said first end of said first switch and said first voltage source;
- (d-3) a second switch having first and second ends, said first and second ends of said first switch being non-connected when the logic of said input signal is "H", said first and second ends of said first switch being connected when the logic of said input signal is "L", said second end being applied to said constant current;
- (d-4) a fourth resistor connected between said first end of said second switch and said first voltage source;
- (d-5) a potential determining resistor between said first end of said first switch and said first end of said second switch.

* * * * *